(12) United States Patent
Hahn et al.

(10) Patent No.: US 9,753,488 B2
(45) Date of Patent: Sep. 5, 2017

(54) BODY PRODUCED BY AN IN-MOLD PROCESS AND PROCESS FOR THE PRODUCTION THEREOF

(71) Applicants: LEONHARD KURZ Stiftung & Co. KG, Furth (DE); POLYIC GmbH & Co. KG, Furth (DE)

(72) Inventors: Martin Hahn, Herrieden (DE); Wolfgang Clemens, Puschendorf (DE); Rainer Sigritz, Nuremberg (DE); Ulrich Schindler, Furth/Bayern (DE); Gerald Golling, Oberasbach (DE)

(73) Assignees: LEONHARD KURZ STIFTUNG & CO, KG, Furth (DE); POLYIC GMBH & CO. KG, Furth (DE)

( * ) Notice: Subject to any disclaimer, the term of this patent is extended or adjusted under 35 U.S.C. 154(b) by 147 days.

(21) Appl. No.: 14/433,984

(22) PCT Filed: Oct. 14, 2013

(86) PCT No.: PCT/EP2013/071388
§ 371 (c)(1),
(2) Date: Apr. 7, 2015

(87) PCT Pub. No.: WO2014/060335
PCT Pub. Date: Apr. 24, 2014

(65) Prior Publication Data
US 2015/0293558 A1    Oct. 15, 2015

(30) Foreign Application Priority Data

Oct. 15, 2012  (DE) ........................ 10 2012 109 820

(51) Int. Cl.
*G06F 1/16*  (2006.01)
*B29C 45/14*  (2006.01)
(Continued)

(52) U.S. Cl.
CPC ................ *G06F 1/16* (2013.01); *B29C 45/14* (2013.01); *B29C 45/14016* (2013.01);
(Continued)

(58) Field of Classification Search
CPC .. B29C 2045/14155; B29C 2045/1477; B29C 45/14; B29C 45/14016; B29C 45/1418;
(Continued)

(56) References Cited

U.S. PATENT DOCUMENTS

2002/0066973 A1   6/2002  Visconti et al.
2008/0213541 A1*  9/2008  Schilling ................... B44C 1/00
                                                          428/161
(Continued)

FOREIGN PATENT DOCUMENTS

DE    102007057934    6/2009
DE    10201044598     1/2012
(Continued)

OTHER PUBLICATIONS

Prof. Dr. F. Ehrig, Prof. Dr. G. Schuster: "Designlösungen mit gesteigerter Funktionalität," Jun. 2011, Swiss Plastics, Aarau, AZ Fachverlage AG, S. 16-17. (English Translation).
(Continued)

*Primary Examiner* — Tony Davis
(74) *Attorney, Agent, or Firm* — Hoffmann & Baron, LLP

(57) ABSTRACT

A body (1, 1', 1") produced by an in-mold process has a first film (2, 2', 2") with at least one electrical or electronic functional layer (25). In a functional area (20a, 20a', 20a") of this functional layer, at least one electrical or electronic component is provided, and at least one electrical connection for this is provided in a contact area (20b, 20b', 20b"). The first film is partially back-injection molded with a plastic main material (3, 3', 3") such that the contact area (20b, 20b', 20b") is at least partially free from this plastic
(Continued)

main material (3). Suitable formation of the first film (2, 2', 2") guarantees that a tab (F) separated from the plastic main material (3, 3', 3") is provided which adjoins a back-injection molded part of the first film in an area of surface (20c, 20c', 20c") of the body which is at a distance from an edge (31, 31') of the body delimiting the surface (30) with the first film.

32 Claims, 32 Drawing Sheets

(51) Int. Cl.
| | | |
|---|---|---|
| *G06F 3/045* | (2006.01) | |
| *G06F 3/044* | (2006.01) | |
| *H05K 1/02* | (2006.01) | |
| *H05K 1/09* | (2006.01) | |
| *B29C 45/44* | (2006.01) | |
| *H05K 3/00* | (2006.01) | |

(52) U.S. Cl.
CPC .... *B29C 45/1418* (2013.01); *B29C 45/14221* (2013.01); *B29C 45/14262* (2013.01); *B29C 45/14336* (2013.01); *B29C 45/14377* (2013.01); *B29C 45/14639* (2013.01); *B29C 45/14754* (2013.01); *B29C 45/14778* (2013.01); *G06F 3/044* (2013.01); *G06F 3/045* (2013.01); *H05K 1/028* (2013.01); *H05K 1/092* (2013.01); *B29C 45/44* (2013.01); *B29C 2045/1477* (2013.01); *B29C 2045/14155* (2013.01); *G06F 2203/04103* (2013.01); *G06F 2203/04107* (2013.01); *H05K 3/0014* (2013.01); *H05K 2201/0145* (2013.01); *H05K 2201/026* (2013.01)

(58) Field of Classification Search
CPC ........ B29C 45/14221; B29C 45/14262; B29C 45/14336; B29C 45/14377; B29C 45/14639; B29C 45/14754; B29C 45/14778; B29C 45/44; G06F 1/16
USPC .......................................................... 428/161
See application file for complete search history.

(56) References Cited

U.S. PATENT DOCUMENTS

| | | |
|---|---|---|
| 2011/0134655 A1 | 6/2011 | Ohtani et al. |
| 2015/0257265 A1* | 9/2015 | Ullmann ........... B29C 45/14639 324/658 |

FOREIGN PATENT DOCUMENTS

| | | |
|---|---|---|
| DE | 102011103824 | 12/2012 |
| EP | 2695715 | 2/2004 |
| EP | 2228258 | 9/2010 |
| JP | 2009238661 | 10/2009 |
| JP | 2011240679 | 12/2011 |
| JP | 2012011691 | 1/2012 |

OTHER PUBLICATIONS

Prof. Dr. F. Ehrig, Prof. Dr. G. Schuster: "Designlösungen mit gesteigerter Funktionalität," Jun. 2011, Swiss Plastics, Aarau, AZ Fachverlage AG, S. 16-17.

Prof. Dr. F. Ehrig, Prof. Dr. G. Schuster: "Designlösungen mit gesteigerter Funktionalit•t," Jun. 2011, Swiss Plastics, Aarau, AZ Fachverlage AG, S. 16-17.

* cited by examiner

BODY PRODUCED BY AN IN-MOLD PROCESS AND PROCESS FOR THE PRODUCTION THEREOF

This application claims priority based on an International Application filed under the Patent Cooperation Treaty, PCT/EP2013/071388, filed on Oct. 14, 2013, and German Application No. DE 102012109820.4, filed on Oct. 15, 2012.

BACKGROUND OF THE INVENTION

The invention relates to a body, namely a plastic part, which is produced in particular by an in-mold process. It also relates to an electrical or electronic device with such a body, a process for producing such a body, and a film element that can be used in the process.

In the case of an in-mold process, a distinction is drawn between in-mold labeling (IML) and in-mold decoration (IMD). In the in-mold process in the present case, in particular, a first film is back-injection molded. In in-mold labeling the entire first film becomes part of the finished body or plastic part. In in-mold decoration a roll-to-roll process is used in which a strip of film is guided through the injection mold. The strip of film has a carrier layer and a transfer layer. The transfer layer can be detached from the carrier layer. In particular after the back-injection molding, the transfer layer remains on the finished body, whereas the carrier layer is detached and conveyed further.

It is known to use the technique of in-mold labeling in connection with a first film which has at least one electrical or electronic functional layer. At least one electrical and/or electronic component is provided in a functional area of the functional layer; at least one electrical connection is provided in a contact area of the at least one functional layer, which electrical connection is galvanically coupled to at least one component, namely is galvanically coupled in the functional layer, via connections in the latter.

It is now disadvantageous if the contact area is likewise back-injection molded since it then adheres to the injection-molding material and cannot be guided to a counter contact.

SUMMARY OF THE INVENTION

The object of the invention is to demonstrate a way of designing a body which is produced as a plastic part by an in-mold process, in order that it can be optimally used in electrical or electronic devices without there being a problem with the contacting. The object also includes indicating a way of producing such a body.

The object is achieved by a body which has a first film with at least one electrical and/or electronic functional layer, wherein at least one electrical and/or electronic component is provided in a functional area of the functional layer, and wherein at least one electrical connection is provided in a contact area of the at least one functional layer, which electrical connection is galvanically coupled (in particular via connections in the functional layer) to at least one component, wherein the body furthermore comprises a plastic main material with which the first film is partially back-injection molded such that the contact area is at least partially free from plastic main material, wherein the first film is formed such that a tab separated from the plastic main material is provided by a non back-injection molded part of the first film, which tab adjoins a back-injection molded part of the first film in an area of surface of the body which is at a distance from an edge of the body delimiting the surface with the first film.

The present invention includes two ideas: Firstly, the contact area is at least partially not back-injection molded and therefore can protrude like a tab from the rest of the body, in particular the surface of the plastic main material; it can in particular protrude such that it can be guided to a counter contact, where the at least one electrical connection can actually be connected. The second idea includes providing the non back-injection molded part, in the form of the tab, precisely not at the edge of the body, such as would be particularly easy to realize in terms of production technology; but rather having the tab protrude from an area of surface of the body which is located in the middle of the body. The tab can thus be employed such that the side of the tab facing towards the surface of the rest of the body points towards an area with plastic main material. Therefore, there is still further plastic main material beyond the area of surface in which the back-injection molded area of the first film transitions into the non back-injection molded part of the first film. In this way the body can be placed with its edge area against other elements of an electrical device or be placed in these, without losing the possibility of contacting at the at least one electrical connection. The tab with the at least one electrical connection projects for example into the inside of a housing which is delimited by the body, and wherein the edge of the body sits against other housing parts.

In particular, the feature of a flexible tab can be implemented, and the above description then results in the feature that a body shape which makes it possible at least partially to bring the tab up against the surface of the plastic main material on its side with the first film is predefined by the plastic main material. In other words, the back-injection molded part of the first film is in one piece with the plastic main material, but the film then continues over the plastic main material to a certain degree, but remains separated from the plastic main material in this area.

In an embodiment it is provided that the body has a flat surface, on which the first film is arranged. The tab can be brought into a position or is located in a position in which it protrudes an angle from the range of 15°-90° to the plane from an area of surface which is adjoined on all sides in respect of the surface by plastic main material. Such a flat body can be particularly easily integrated, in the form of a plate, into an electrical device, wherein the plate can provide e.g. a housing side. The protruding tab extends for example to a counter contact provided inside the housing.

In another embodiment the body has a curved surface, on which the first film is arranged. The tab can be brought into a position or is located in a position in which it protrudes at an angle from the range of 75°-0° to a surface normal of the curved surface, wherein the surface normal is defined relative to an area of surface or a point of the surface which is adjoined on all sides in respect of the surface by plastic main material. The angle of 75°-0° to the surface normal corresponds to an angle of 15°-90° to the tangential plane which is defined on such an area of surface. The invention thus can also be implemented in connection with a three-dimensionally laid-out surface on which the first film with the functional layer is arranged. Here too, it is advantageous for a tab that has not been back-injection molded, and is therefore in particular flexible, to be provided, which makes it possible for it to adjoin a counter contact particularly easily.

The distance of the transition area, between the back-injection molded part and the non back-injection molded part of the first film, from an edge of the film can be specified more precisely by the following relationship: the transition area is defined as a line on the surface of the body and an edge contour is defined relative to the edge. Then it is preferably provided that a transition from a back-injection molded part of the film to a non back-injection molded part of the film takes place along a line on the surface which is at a distance of at least 2 mm, preferably at least 3 mm, particularly preferably at least 5 mm, quite preferably at least 8 mm, from an edge contour of the body delimiting the surface with the film. The specification of the distancing relates to the minimum distancing, in particular the line need not run parallel to the edge contour.

In a preferred embodiment of the invention the body has a second film which is likewise back-injection molded with the plastic main material and has a decoration layer. As a rule, this second film will be provided on a side of the body opposite the side with the first film. If the body is transparent overall, the decoration layer can ensure that the first film or its individual layers, including the electrical or electronic functional layer, is not distinguished from the outside. It is particularly preferred if the decoration layer provides at least one item of information in respect of the at least one electrical and/or electronic component. This can take place in particular in the style of a help function.

This embodiment is useful to a particular degree in connection with a touch panel functionality. Quite generally, the body can comprise a functional layer with capacitive components which provide such a touch panel functionality. Such plastic parts can be usefully used in many types of electrical devices, e.g. in mobile telephones, in household electrical appliances ("white goods") or also in and on automobiles. In particular in connection with the decoration layer providing the item of information, the operation of such devices can be made easier, the decoration layer can display what and, where appropriate, how it is to be touched in order to achieve a particular effect.

In a preferred embodiment of the body, a stiffening element is provided on the tab, which stiffening element makes it possible for example to securely adjoin the contact area of the tab to a counter contact. The stiffening element can consist of polyethylene terephthalate, polypropylene, polycarbonate or polyethylene naphthalate and can here have such a film thickness that the total thickness of the remaining film with the stiffening element lies in the range of 150-600 µm, e.g. is approximately 300 µm. Alternatively or in addition, a further contact element can be provided which makes the contacting easier. The further contact element can have a thickness from the range of 1-15 µm, preferably 2-5 µm, and can consist of carbon black or conductive silver.

In principle any thermoplastic is suitable as plastic main material which is injection molded, wherein polymethyl (meth)acrylate, acrylonitrile-butadiene-styrene, polycarbonate or polyamide are preferably provided.

Such a plastic material can be dyed, such that it is not possible to look into the inside of a housing which is delimited by the body. In another preferred variant, on the other hand, the plastic main material is transparent and thus makes it possible to see through the body. This is true to a particular degree when the electrical or electronic functional layer in the first film of the body also has a transparent action. This measure can be achieved for example in that the electrical or electronic functional layer has a plurality of conductive traces (conductor traces) which consist of metal, in particular of silver, copper, aluminum, chromium or of a metal alloy, and which have a width of between 1 µm and 40 µm (preferably between 5 µm and 25 µm), and which at the same time have a distance from each other of from 10 µm to 5 mm (it preferably lies between 300 µm and 1 mm). Such conductor traces cannot be resolved by the human eye, or are difficult for the human eye to resolve, and therefore cannot be recognized individually. The transparency of the electrical functional layer is at least 70% and preferably at least 80% despite the metallic conductor traces. These conductor traces are preferably provided in a layer thickness from the range of 10-150 nm, preferably from the range of 30-60 nm.

The electrical or electronic functional layer can also comprise such conductive traces made of metal, in particular the named materials, which are at least 100 µm wide. Such traces are very visible per se, but they can be masked by a plastic material, for instance in a separate decoration layer or by the substrate.

In another embodiment the electrical functional layer has organic conductors such as PAni (polyaniline) or PEDOT/PSS (poly-3,4-ethylenedioxythiophene-polystyrenesulfonate). Moreover, the electrical or electronic functional layer can comprise metal nanowires (e.g. made of silver, copper or gold) or metal nanoparticles (likewise e.g. silver, copper or gold), or carbon nanotubes or carbon nanoparticles or graphene.

Furthermore, combinations of the named materials can be provided in the functional layer.

The first film usually comprises a substrate which carries the further layers and in particular the functional layer. This substrate consists of plastic, wherein in particular polyethylene terephthalate, polypropylene, polycarbonate, polyethylene naphthalate are suitable, preferably in a thickness from the range of 12-150 µm, particularly preferably from the range of 35-60 µm.

In order to protect the further layers, during the back-injection molding, from the high temperature of the injection-molding material (the plastic main material), the substrate can be arranged between the functional layer and the plastic main material.

However, it can also be advantageous if the functional layer is arranged between the substrate and the plastic main material; then the substrate on the finished body itself namely serves as protection for the functional layer.

In order that injection-molding material adheres well to a film material, an adhesion-promoter layer is routinely provided. Correspondingly such an adhesion-promoter layer is preferably provided at least on the part of the first film back-injection molded with plastic. (Either no adhesion-promoter layer or a layer with the opposite action, i.e. the suppression of the adhesion, is provided on the part of the first film not back-injection molded with plastic.) The adhesion-promoter layer can consist of a single layer, but there is also the possibility of providing two different partial layers made of different material as adhesion-promoter layer.

The object is also achieved by the provision of an electrical device which comprises a housing, in or against which a body of the type according to the invention is placed, wherein an electrical or electronic component is arranged in the housing, which component is galvanically coupled, via the tab protruding from the plastic main material, to the electrical or electronic functional layer (namely in particular the one or more components in the latter). Here the function of the tab is utilized explicitly for producing a connection. The electrical device can be a mobile telephone (cellphone, smartphone), but also a household appliance, such as a washing machine, dishwasher, an oven or a stove and the like. Finally, it can also be an automobile accessory, e.g. the body can become or be part of the human-machine interface in such an automobile. The electrical device can also belong to household electronics such as for example a television set, a DVD player, games consoles and the like. The electrical device can furthermore be an item of medical equipment, for instance a handheld device such as a glucose meter, but also a measurement device and any other examination device. The electrical device can also be an automation device.

In one aspect the invention also comprises a process for producing a body, wherein it is in particular a body of the type according to the invention. There are two possible processes, which both achieve the object.

In a first aspect of the invention a process for producing a body is provided in which a first film is inserted into an injection mold, wherein the first film, in a first area, has adhesion properties in respect of a predetermined injection-molding material which are qualitatively better than the corresponding adhesion properties in a second area of the first film—thus the injection-molding material can adhere better to the first area than to the second area—wherein the second area has the form of a tongue protruding from the first area, wherein in the process the predetermined injection-molding material is injected into the injection mold with the first film, with the result that the first film is partially back-injection molded and then the produced body (naturally after the injection mold has been opened) is removed, wherein in the produced body, because of the different adhesion properties, injection-molding material adheres to the first film in the first area, but injection-molding material adheres poorly or does not adhere to the first film in the second area. If it adheres poorly, the step of peeling off, in particular manually, the second area from the injection-molding material can still follow, with the result that the tab already named above forms.

In a preferred embodiment a film is inserted which comprises an adhesion-promoter layer in the first area. Because of the different adhesion properties between the first and the second area, this means that in the second area either no adhesion-promoter layer is provided or a countermeasure is taken. This countermeasure can also be taken independently of whether an adhesion-promoter layer is provided. A further preferred embodiment is thus that a film is inserted which comprises, in the second area, a layer suppressing the adhesion (to the predetermined injection-molding material).

In a second aspect of the invention a production process for a body is provided, in which a first film is inserted into an injection mold, which film has a first area from which a second area protrudes in the form of a tongue, and wherein in the process the second area is clamped between two clamping parts and wherein injection-molding material is injected into the injection mold and thus the first area of the first film is back-injection molded (and in particular the second area is not back-injection molded at least partially, because the clamping parts separate or disconnect the second area from the injection-molding material). When clamped the two sides do actually touch, with the result that material cannot reach between the clamping part and the second area of the first film protruding in the form of a tongue.

It is preferably provided here that the injection mold is formed such that injection-molding material is provided on both sides of a transition area from the first area to the second area of the first film. This means nothing more than that the non back-injection molded second area or part of the second area forms a tab which protrudes from a transition area which is at a distance from an edge of the produced body delimiting the surface with the first film. For example, the shape of the body then makes it possible to bring the tab at least partially up against the surface of the injection-molding material on its side with the first film.

As clamping elements, the mold halves of the injection mold can be allowed to cooperate with a further element, either a separate slide, an inclined ejector guided in the mold half of the injection mold or a spring-loaded ejector mounted in the mold half of the injection mold. Similarly it is also possible to provide two clamping jaws that can be separated from each other by a collapsible core, wherein these clamping jaws are in particular arranged on one of the two mold halves.

In addition to an injection mold that can be divided into two mold halves, these two embodiments can correspondingly also be implemented in injection molds with more than two mold parts. The two aspects of the production of a body can also be implemented in a single process. Naturally, the specified steps then need not be carried out twice in each case. For example, the step of inserting the first film and introducing injection-molding material into the injection mold would be carried out only once, wherein, however, the different adhesion properties to the first film are implemented at the same time as a clamping of a protruding tongue is realized.

In a preferred embodiment of the process according to the invention a second film is introduced into the injection mold, which film is likewise back-injection molded. This can be in particular an in-mold decoration, thus a film is inserted which comprises a carrier layer and a transfer layer and is supplied in a roll-to-roll process. After the back-injection molding, the transfer layer at least partially adheres to the injection-molding material and is detached from the carrier layer. The carrier layer is taken away in the roll-to-roll process.

According to a still further aspect of the invention the achievement of the object consists in providing a film element, such as can be used in the production of the body according to the invention. The film element is characterized by its different adhesion properties in two different areas, wherein these adhesion properties are defined in respect of the injection-molding material which is to form the plastic main material in the later body. Either the first area is provided with an adhesion-promoter layer and the second area is not or both areas are provided with an adhesion-promoter layer, but then a further layer suppressing the adhesion is located on it in the second area.

BRIEF DESCRIPTION OF THE DRAWINGS

Preferred embodiments of the invention are described in more detail below with reference to the drawing, in which.

DETAILED DESCRIPTION OF THE INVENTION

Figure 1:
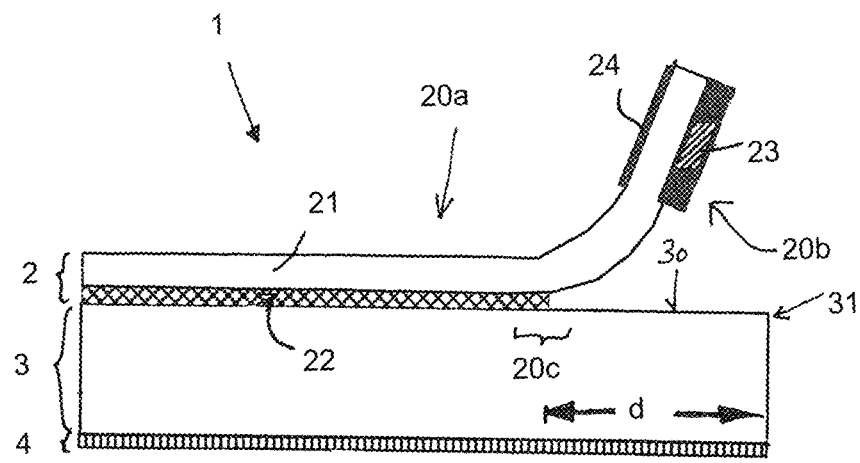
FIG. 1 shows a schematic sectional view through a plastic part as a body according to the invention according to a first embodiment of the invention.

A body shown in FIG. 1 and labeled 1 throughout comprises a first film 2, injection-molding material 3 and a second film 4. The layer thicknesses of the individual components are not shown to scale here. The first film 2 forms a film element which comprises a substrate 21 which adheres, via an adhesion-promoter layer 22 (also called "primer"), to the injection-molding material 3. However, this adhesion only occurs in a first area 20a of the first film 2, whereas a second area 20b of the first film does not adhere to the surface 30 of the injection-molding material 3. The transition area 20c between the first and the second area is at a distance of several millimeters, for example 5 mm, from an edge contour 31 of the injection-molding material 3, see the distance d drawn in FIG. 1. The second area 20b of the first film 2 carries a strengthening element 23 which increases the stiffness of the end of the second area 20b. In addition, a contact reinforcement 24 is provided.

In the present case, the first film is to be such a film which carries an electrical functional layer, for example in the form of capacitive elements for providing a touch panel functionality (with the result that the film 2 is a sensor film). Alternatively or in addition, it is possible for the film 2 to carry light-emitting diode elements, e.g. organic light-emitting diodes ("OLEDs"). The second area 20b, which in the present case has the form of a tab protruding from the first area 20a, can in particular be a contact area, comprise such a contact area or be only a part of a contact area; it is important that an electrical connection for the elements is provided in the electrical functional layer in the area of this tab, thus in the second area 20b, and the contact reinforcement 24 has the function of making it easier to contact this connection element with a counter contact.

Figure 2:
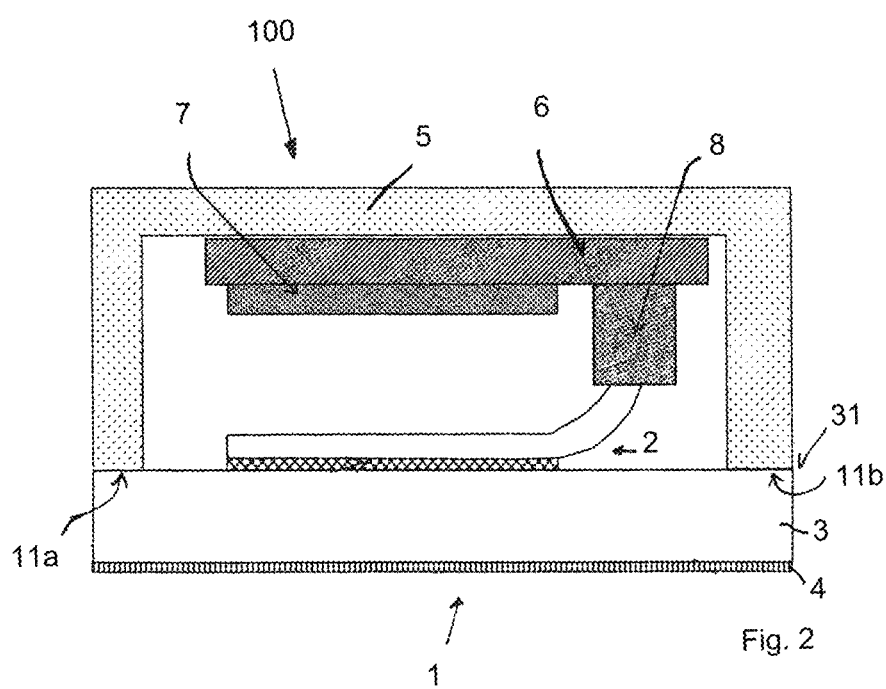
FIG. 2 shows a schematic section through an electronic device in which the body from FIG. 1 is used, FIGS. 3A/3B show, in top view and in section respectively, a first production stage for a film element used in the body according to the invention according to a first embodiment, FIGS. 4A/4B show, in top view and in section respectively, a second production stage for the film element used in the body according to the invention, FIGS. 5A/5B show, in top view and in section respectively, a third production stage for the film element used in the body according to the invention, FIGS. 6A/6B show, in top view and in section respectively, a fourth production stage for the film element used in the body according to the invention, FIGS. 7A/7B show, in top view and in section respectively, a film element used in the production of a body according to the invention according to a second embodiment in a first production stage, FIGS. 8A/8B show, in top view and in section respectively, the film element used in the production of the body according to the invention according to a second embodiment in a second production stage, FIGS. 9A/9B show, in top view and in section respectively, the film element used in the production of the body according to the invention according to a second embodiment in a third production stage, FIGS. 10A/10B show, in top view and in section respectively, the film element used in the production of the body according to the invention according to a second embodiment in a fourth production stage, FIGS. 11A/11B show, in top view and in section respectively, the film element used in the production of the body according to the invention according to a second embodiment in a fifth production stage.

The significance of the protrusion of the tab results from the use of the body 1 in an electronic device 100, which is shown in FIG. 2: the electronic device comprises a housing part 5, which, however, does not form a closed housing, but rather requires that the body 1 be placed on in order to provide a housing that is closed overall. The body 1 sits, in particular in an area 11a or 11b, against its respective edge on the housing part 5. Because the tab now protrudes from the surface 30 of the injection-molding material 3, the film 2 can be contacted inside the thus-formed housing of the electronic device 100. The contacting takes place with an electronic circuit board 6, which optionally carries light-emitting elements or a display 7, which can backlight the body 1, via a plug-in connection 8. In particular, the end of the tab, thus of the second area 20b, provided with the strengthening element 23 and the contact reinforcement 24 is plugged into the plug-in connection 8, with the result that an electrical contact between the electronic circuit board 6 and the components or functional elements in the first film 2 is provided.

The second film 4 can comprise a complete label, which is provided within the framework of an in-mold labeling. However, the second film 4 is preferably only the transfer layer of a transfer film which was detached from a carrier layer during the production process. In this case, the second film 4 can also be called a lacquer package.

The second film 4 comprises a decoration layer or decoration sheet that is over the whole surface or partial and the function of which consists, in particular in addition to just decoration, in providing an item of information in respect of the first film 2 or the components contained therein, and in forming a protective layer against mechanical, physical and/or chemical actions. If the first film is a film with touch panel functionality, the individual touch panels can be displayed through the decoration layer. An operator then need only tap on the symbolically shown touch panels and, because of a capacitive interaction, the capacitive components in the first film 2 detect this tapping in cooperation with the electronic circuit board 6.

Alternatively, the second film 4 can have exclusively the function of a protective layer. This is the case e.g. when a touchscreen is provided by the body 1, for instance for use in a smartphone; it is then desirable if the second film 4 is transparent. A display can then be arranged behind the touch panel sensor and show the item of information for operation. In this case the film need not be completely transparent, but rather can have a transparent area in the display area and a frame at the edge.

There are now different possibilities for how a body in the style of the body 1 from FIG. 1 can be produced. A first process for producing such a body is described with reference to FIGS. 3a/b to 6a/b:

The figures labeled "B" in each case display the section along the line "A-A" from the respectively associated figure labeled "A".

Figure 3A:
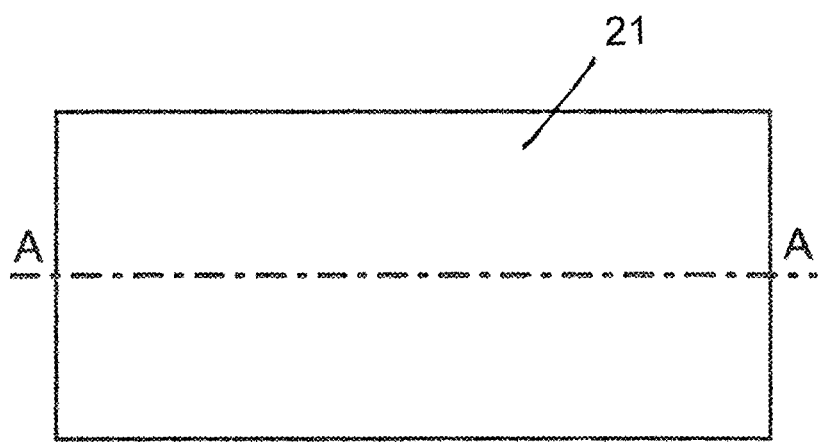
Figure 3B:
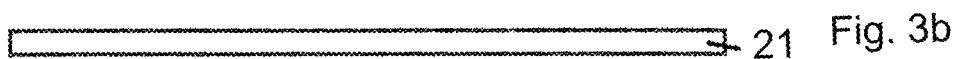
Figure 4A:
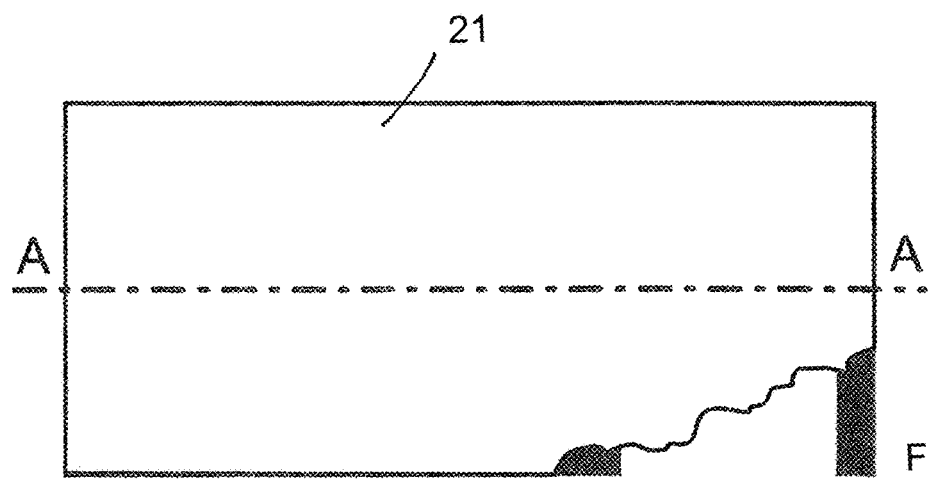
Figure 4B:
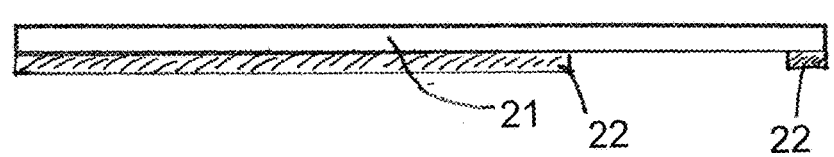
Figure 5A:
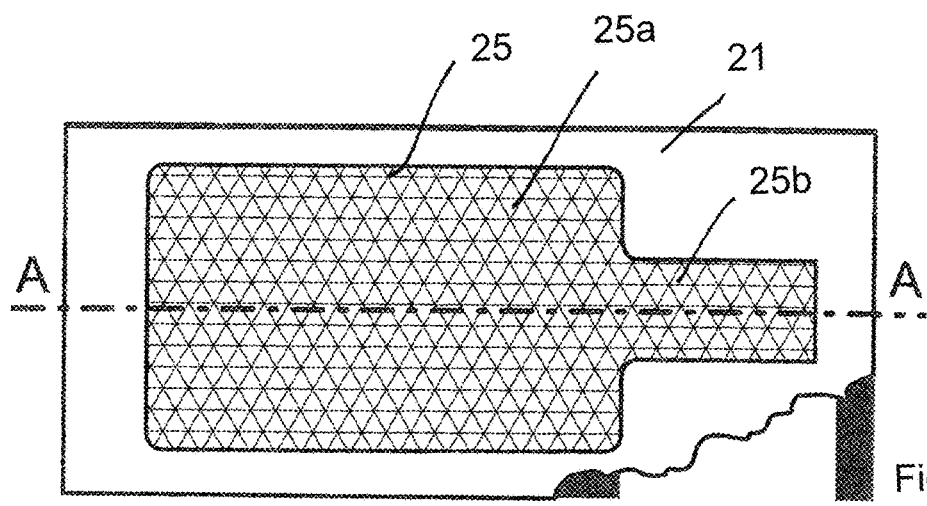
Figure 5B:
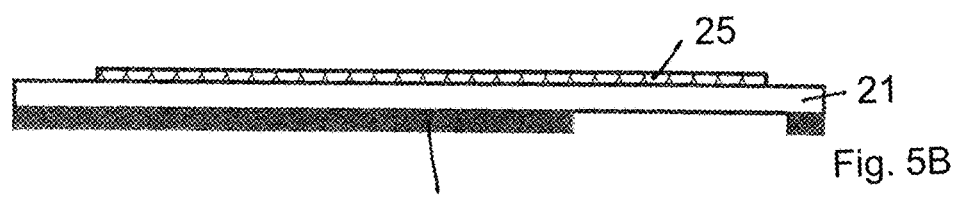
Figure 6A:
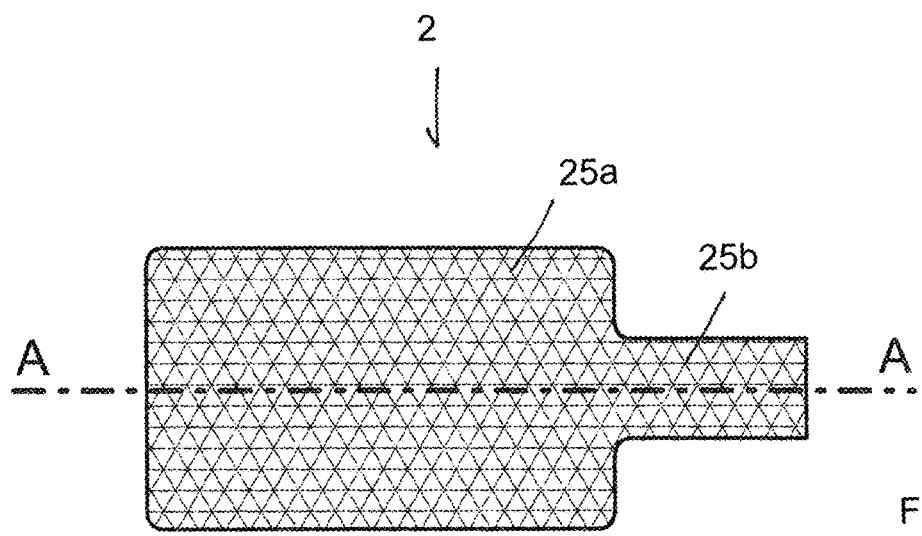
Figure 6B:
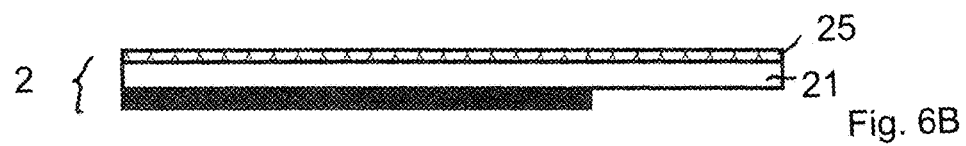

First the substrate 21 is provided (FIGS. 3A/B). Then a partial coating of this substrate 21 with an adhesion-promoter layer 22 takes place, see FIGS. 4A/B. Afterwards, an electrical functional layer 25 is applied to the substrate 21 on the side facing away from the adhesion-promoter layer 22, see FIGS. 5A/B. It is clear from FIG. 5A that the electrical functional layer 25 is not applied over the whole surface, but rather comprises a first area 25a from which a tongue-shaped second area 25b protrudes. The mapping on the substrate 21 is the design in which the tongue-shaped area 25b lies above the area of the substrate 21 which is not coated with the adhesion-promoter layer 22.

The first film 2 is then cut, wherein essentially the functional element just described is cut out. Here too, the first area 25a and the second area 25b and the corresponding mapping of the area in the substrate 21 lying underneath it are thus obtained.

If such a film 2 is now back-injection molded, the body 1 from FIG. 1 can be obtained.

Figure 7A:
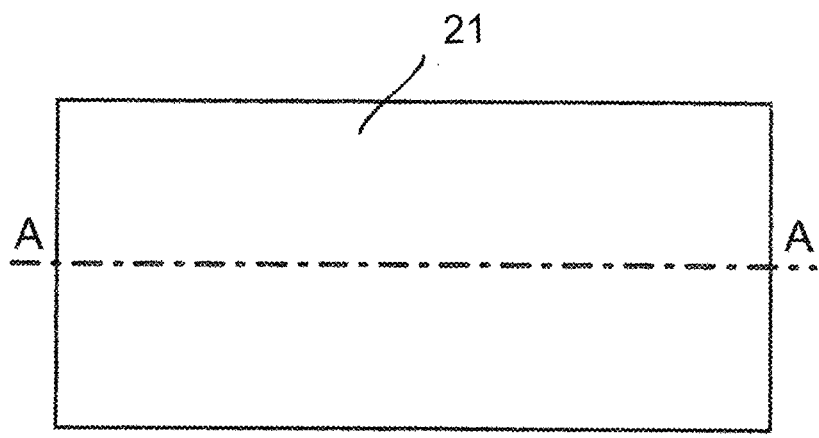
Figure 7B:
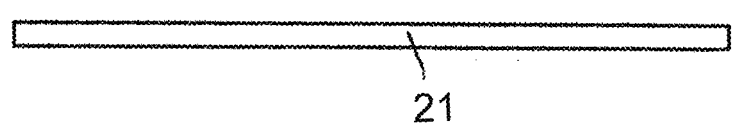
Figure 8A:
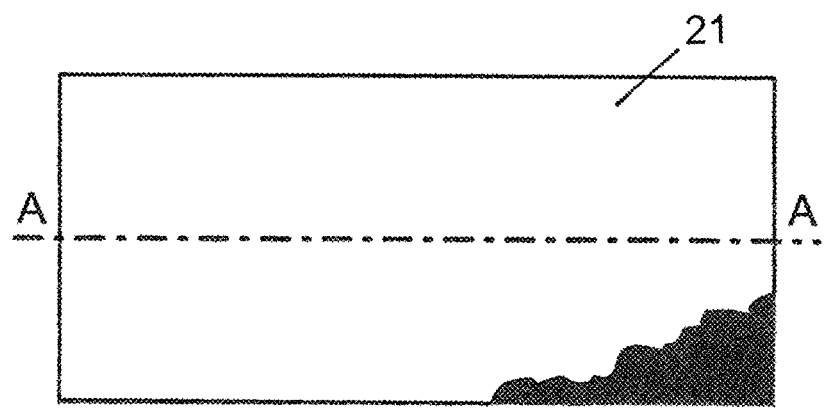
Figure 8B:
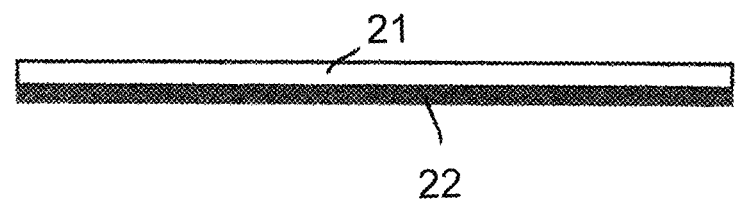
Figure 9A:
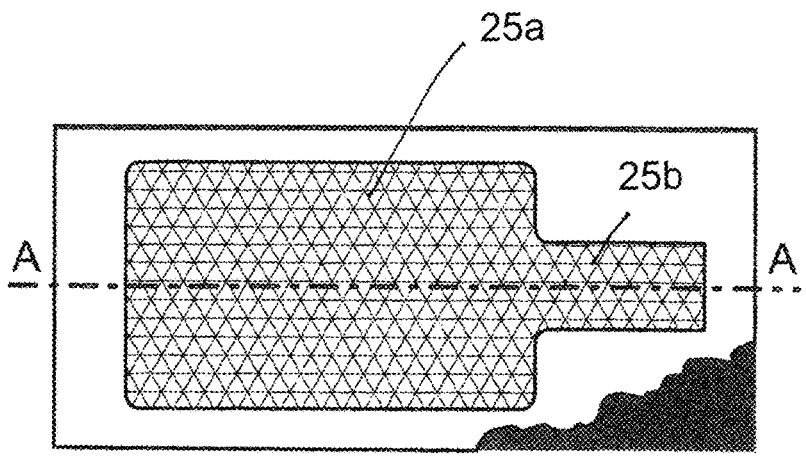
Figure 9B:
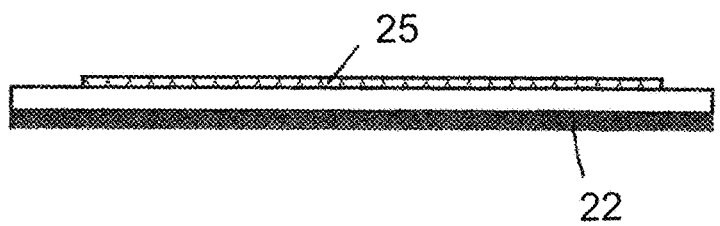
Figure 10A:
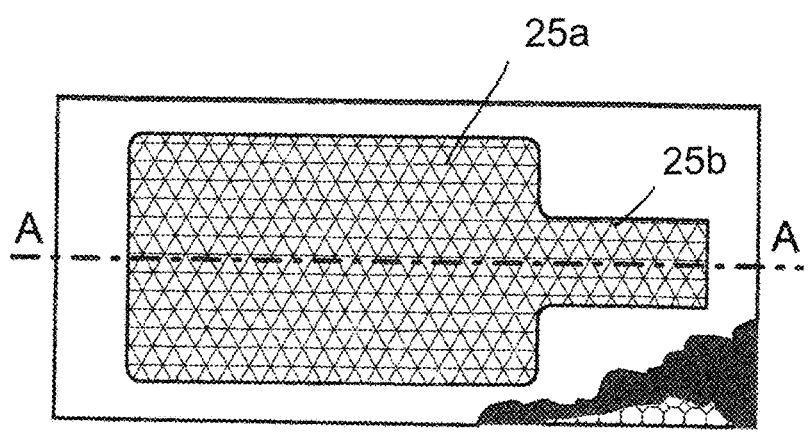
Figure 10B:
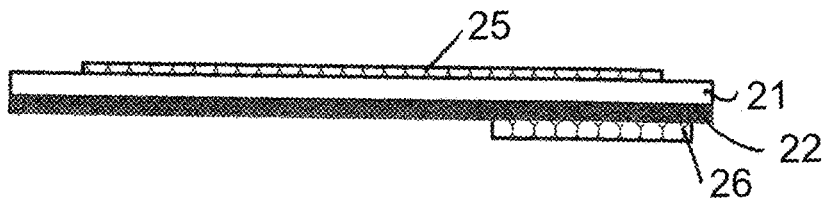
Figure 11A:
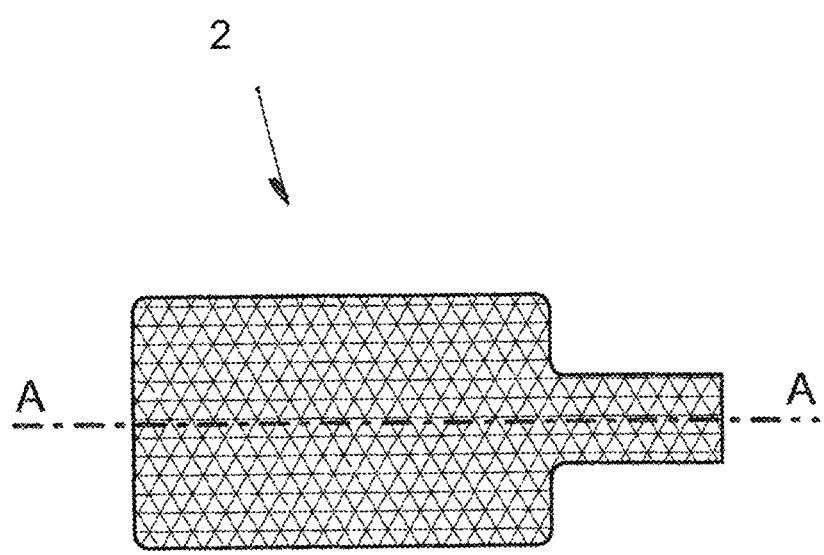

In a second embodiment of the process, the substrate 21 is again also provided first, see FIGS. 7A/B, but this is then coated over the whole surface with an adhesion-promoter layer 22, as can be seen in FIGS. 8A/B; FIG. 8A here represents the production stage in a partial outline. Here too, see FIGS. 9A/B, an electrical functional layer 25 is then applied which once again comprises a first area 25a and a tongue-shaped area 25b protruding from this. The adhesion-promoter layer here is now also located underneath the tongue-shaped area 25b. However, its action is inhibited by an additional layer (anti-adhesion layer) 26 suppressing the adhesion, namely precisely in the area underneath the tongue-shaped area 25b of the functional layer 25. Here too, the functional element is again stamped or cut out to provide the first film 2, see FIGS. 11A/B. This first film 2 is also suitable to be used in the production of the body 1 from FIG. 1.

Figure 11B:
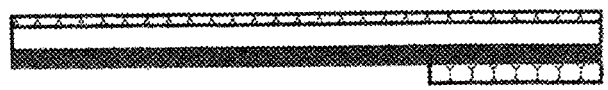
Figure 12A:
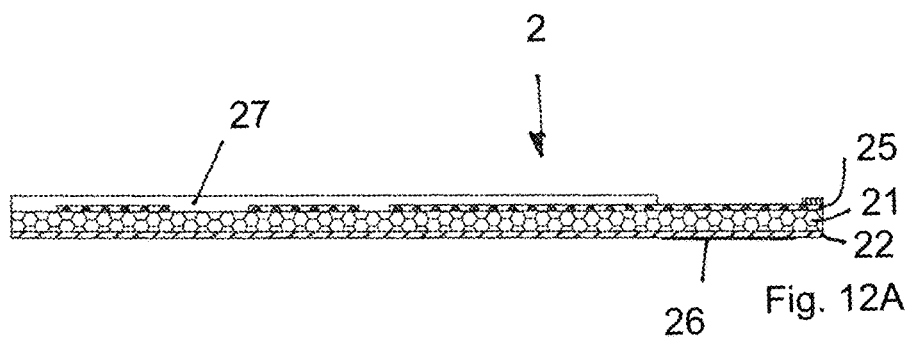
FIG. 12A shows, in section, a film element in the style of the film element shown in FIG. 11B with a further layer.
Figure 12B:
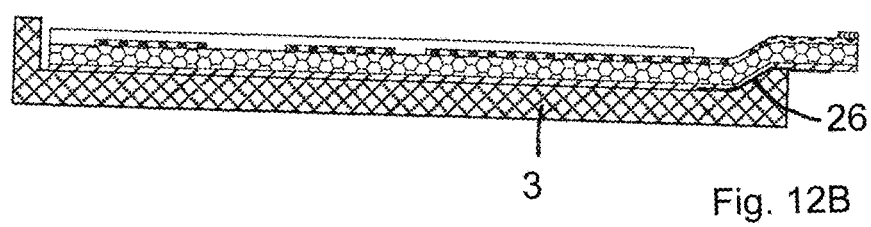
FIG. 12B shows, in section, the film element from FIG. 12A after a back-injection molding, whereby a plastic part is produced.
Figure 12C:
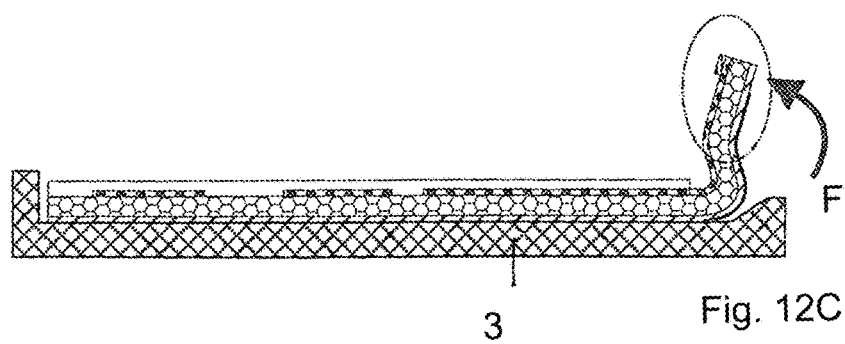
FIG. 12C shows the plastic part from FIG. 12B after the tab has been partially raised.

FIGS. 12A-C show this situation with the first film 2, which, beyond the situation represented in FIG. 11b, also has an additional layer 27 as protective layer for the electrical functional elements in the functional layer 25. If the film from FIG. 12A is back-injection molded, the situation according to FIG. 12B is obtained. The injection-molding material 3 likewise in particular adjoins the layer 26 suppressing the adhesion. In this area, however, the film 2 can be peeled off from the injection-molding material 3, with the result that the situation that arose in FIG. 12C arises, in which a tab F protrudes substantially perpendicularly from the injection-molding material 3. As represented at the start with reference to FIG. 1, such a tab F serves, in the second area 20b of the first film 2, for the contacting represented in FIG. 2 in an electrical or electronic device.

With reference to FIGS. 3A/B to 6A/B on the one hand and 7A/B to 11A/B, two alternative processes for producing a film element as first film 2 have been represented. With reference to FIGS. 13A to 13D, a first process is explained below which in each case follows a production process for the first film 2. With reference to FIGS. 14A to 14D, a second such process is explained which alternatively follows these two production processes for the first film 2.

Figure 13A:
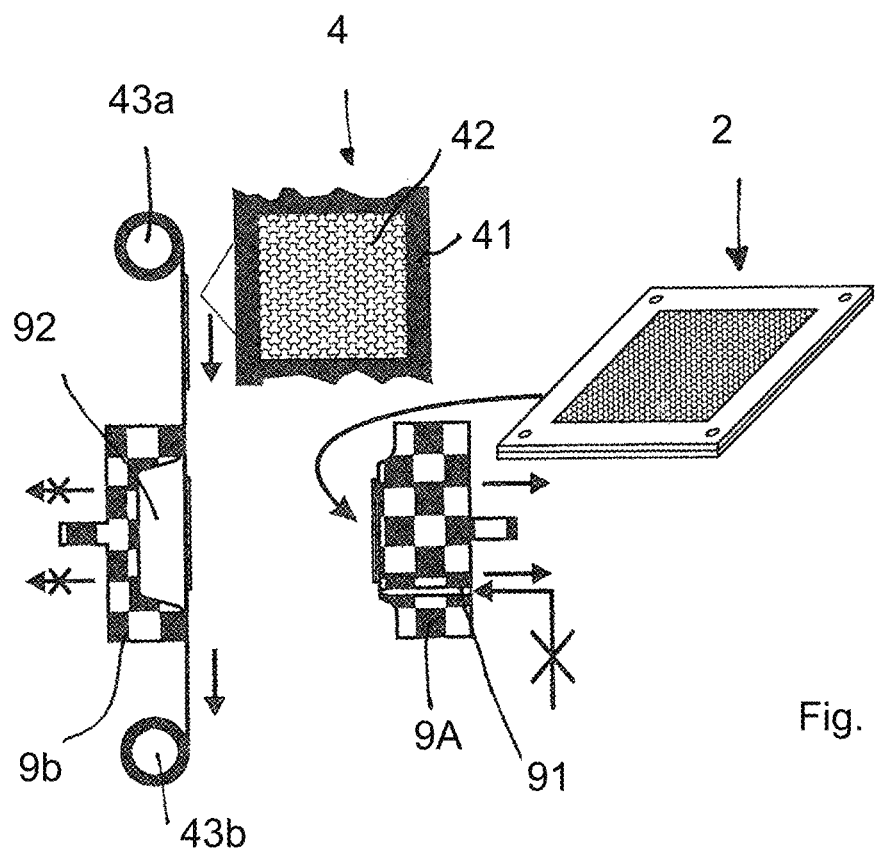
FIGS. 13A-13D show the components used in a process for producing a body according to a first alternative, in different production stages.

An injection mold shown in FIG. 13A in the present case comprises two mold halves 9A and 9B. In the present case, both an in-mold labeling and an in-mold decoration are to take place in one step. The label is provided in the form of the above-described second film 2. This is laid on the injection mold half 9A by hand and negative pressure is applied to it, with the result that it adapts to the mold half 9A. The arrows in FIGS. 13A to 13D and 14A to 14D here show the direction of action of the negative pressure. Crossed-out arrows mean that no negative pressure is provided or no injection-molding material is introduced via an injection-molding supply line 91. In the area of the second injection mold 9B which provides a cavity 92, the second film 4 is provided, namely in the form of a film web which comprises a carrier film 41 with a decoration layer 42. The decoration layer 42 repeats itself here over the course of the carrier film. The film web is unrolled from a first roll 43a and later rolled up on a second roll 43b, the arrows pointing downwards in the figure here stand for the direction of transport.

Figure 13B:
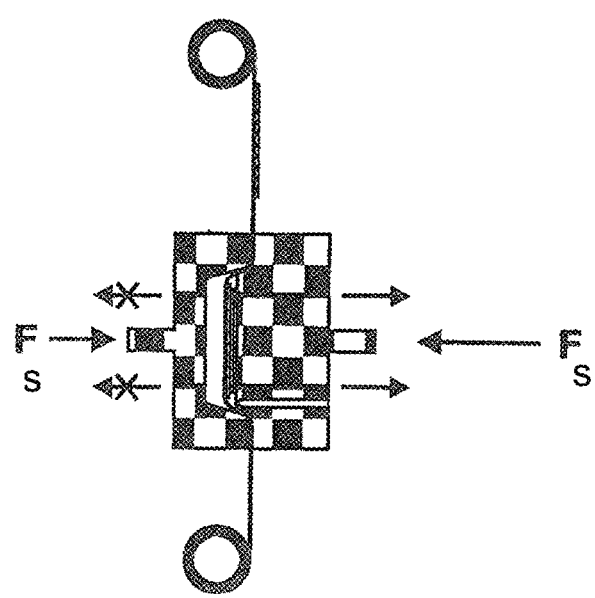

Once the first film 2 has been put in place on the first mold half 9A and the second film 4 has been put in place on the second mold half 9B, the latter optionally with the aid of a sensor (not shown in the figure) that ensures registration accuracy, a closing force $F_S$ is exerted on the two mold halves 9A/B. Negative pressure is still applied to the first film 2, but negative pressure is not applied to the second film 4. The situation shown in FIG. 13B is thus obtained.

Figure 13C:
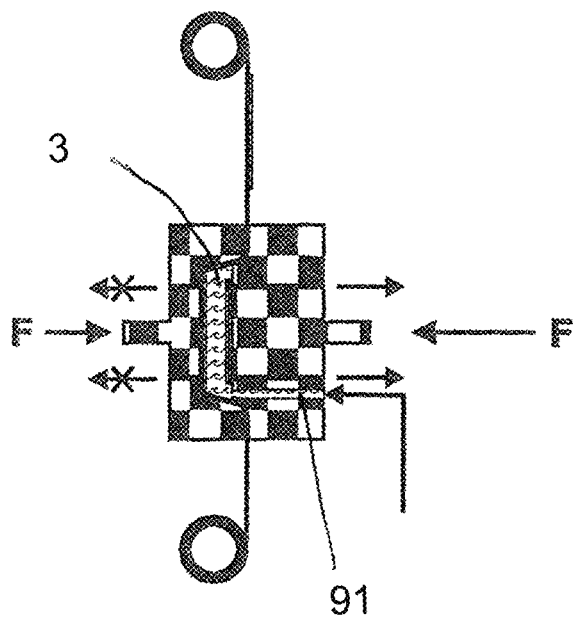
Figure 13D:
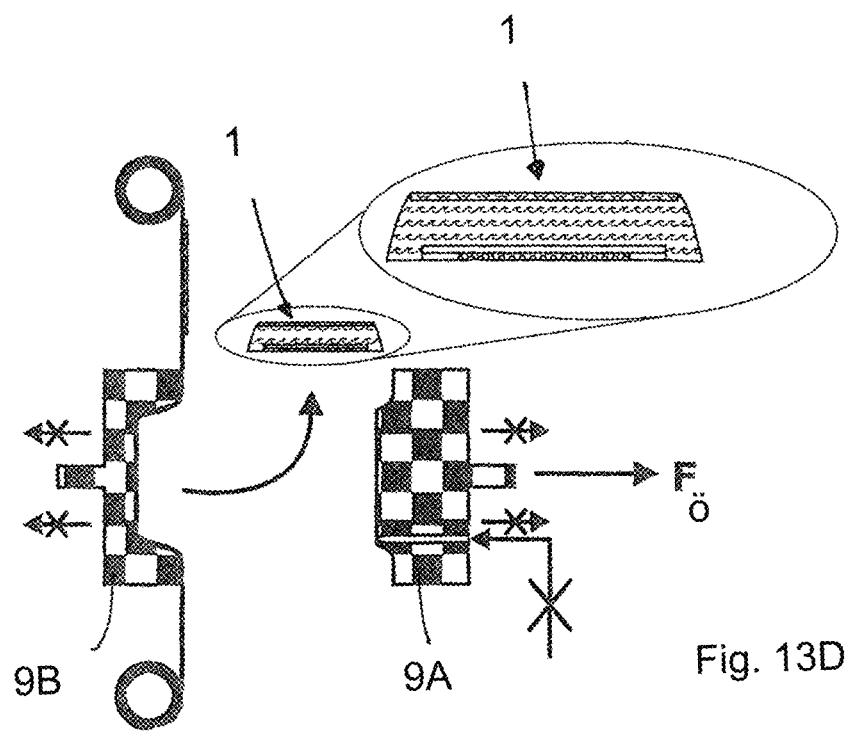

Further subsequently injection-molding material 3 is injected between the first film 2 and the second film 4 via a supply line 91, with the result that both films 2 and 4 are back-injection molded, see FIG. 13C. After the two injection mold halves 9A/B have been opened, under the application of the opening force $F_Ö$, the finished body 1 is obtained; it is shown in FIG. 13D in the correct scale in relation to the injection-mold halves 9A/B, but at the same time on an enlarged scale.

Figure 14A:
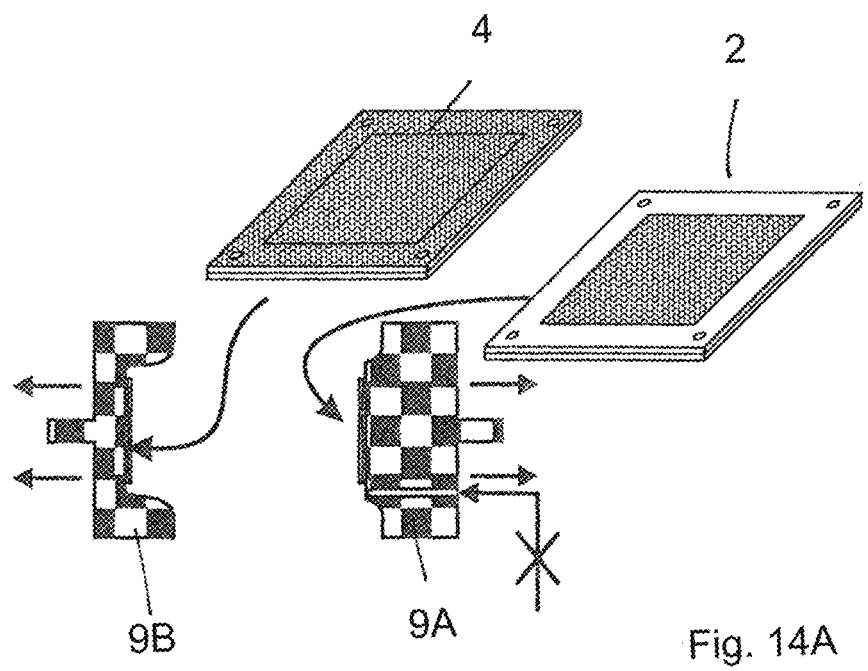
FIGS. 14A-14D show the components used in a process for producing a body according to a second alternative, in different production stages.
Figure 14B:
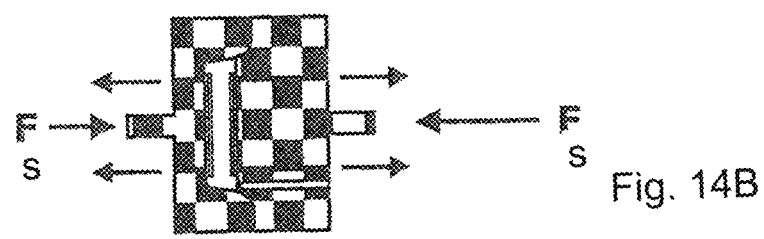
Figure 14C:
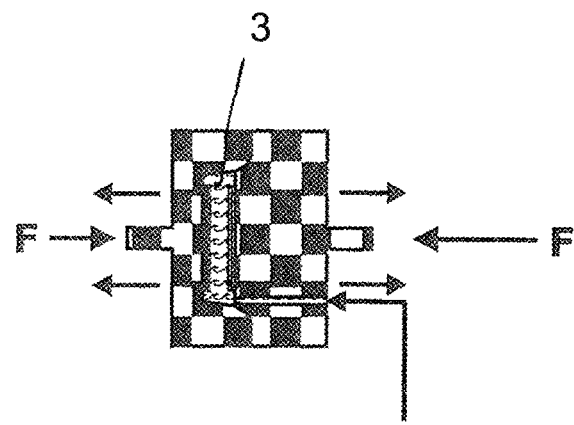
Figure 14D:
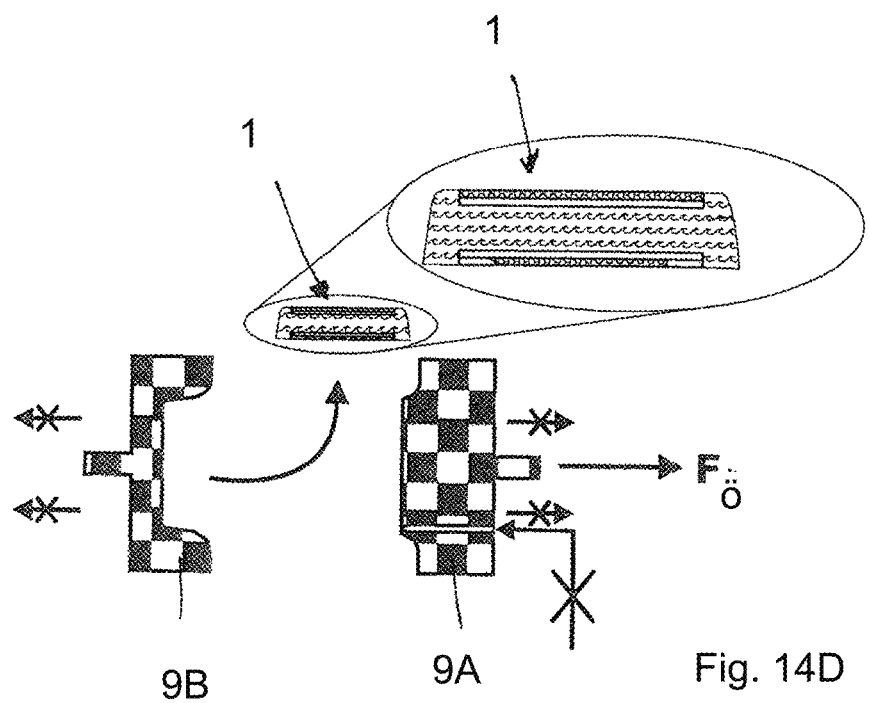

In the alternative process, the film 2 is once again placed on the first injection mold 9A, but at the same time the second film 4, likewise in the already cut-out form, is manually placed in the second mold half 9B (FIG. 14A). In a subsequent step of closing, the closing force $F_S$ is applied, wherein negative pressure is applied to the first film 2 and the second film 4 at the same time. While maintaining the negative pressure, according to FIG. 14C the injection-molding material 3 is poured in, and a body 1 is now obtained according to FIG. 14D once again after the mold halves 9A/B have been opened.

After the representation of the production process for the body 1, the specification of a few important values now follows.

Figure 15:
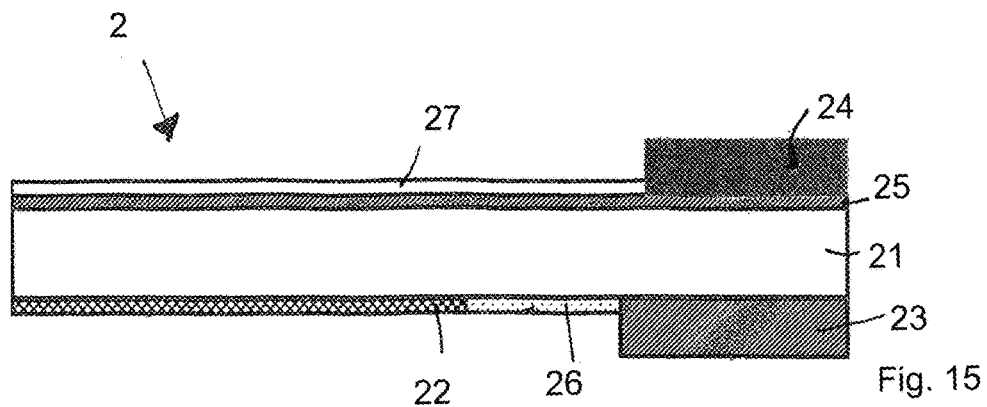
FIGS. 15-17 show different layer structures for a film element that can be used in the body according to the invention, in schematic section.

In the layer structure shown in FIG. 15 for the first film 2, the substrate 21 consists of plastic, for example polyethylene terephthalate, polypropylene, polycarbonate, polyethylene naphthalate, polyamide and similar material, wherein the substrate 21 has a layer thickness of from 12 to 600 μm, typically of from 35 to 60 μm.

The electrical functional layer in the present case is provided in the form of a metal layer which comprises silver, copper, aluminum, chromium or other metals or metal compounds and alloys. The layer thickness of this metal layer is between 10 and 150 nm, typically between 30 and 60 nm. The metal layer is in particular not continuous, but comprises metallic conductor traces in an either particularly regular or precisely irregular pattern, wherein the conductor traces in each case have a width of between 1 µm and 40 µm, preferably approximately 5 µm and 20 µm, and have a distance from each other of between 100 µm and 5 mm, preferably of between 300 µm and 1 mm. Such metallic conductor traces cannot be recognized by the human eye without an aid. The electrical functional layer 25 thereby has a transparent action, although electrical components are provided. For instance in the case of a touch panel functionality, the individual touch panels are formed by electrical conductor traces which are galvanically coupled to each other. The capacitive coupling takes place to other touch panels which are not galvanically coupled to these conductor traces and, for their part, have a plurality of metallic conductor traces which are galvanically coupled to each other one below another.

The invention is not limited to the use of metallic conductor traces for providing a touch panel functionality. Any conductive and semi-conductive elements can contribute to the provision of electrical and electronic components. For example, metals can be provided in the form of nanowires (for instance made of silver, copper or gold) or nanoparticles (for instance made of silver, gold or copper), carbon nanotubes or carbon nanoparticles can be provided, or elements made of graphene can be provided. Moreover, organic conductors made of PEDOT/PSS (poly-3,4-ethylenedioxythiophene/polystyrenesulfonate) or of PAni (polyaniline) can be provided. In particular, active electrical components such as for example organic light-emitting diodes, inorganic or organic photovoltaic cells, other display elements such as for instance made of electroluminescent materials, electrochromic materials or electrophoretic materials can be provided, integrated circuits or inorganic or organic memories can be provided. All of these can equally be used within the framework of the present invention. This applies to all layer structures and sequences described in this application and all named production processes.

The protective layer 27 on the electrical functional layer 25 consists for example of polyacrylate, polyvinyl chloride, polyvinyl acetate, polyurethane, polycarbonate, polyester, an ethylene vinyl acetate copolymer, a hydrocarbon resin, chlorinated polyolefin, polyvinyl alcohol, melamine resin, ketone/formaldehyde resin, polyvinylidene fluoride, epoxy resin, polystyrene, a polymeric cellulose compound, phenolic resin, polyamide, polymeric liquid crystals (LCPs), urea resin and synthetic resin or of a combination of these substances. This includes both thermally cured and radiation-cured lacquer systems.

For better lacquerability and to increase the surface quality, such as e.g. the scratch resistance of the corresponding lacquer layers, various additives can be added to the base lacquer. Wetting additives, leveling additives, anti-foaming agents and fillers such as e.g. nanoscaled silicas are suitable.

The layer thickness of the protective layer 27 is between 1 and 25 µm, preferably between 2 and 6 µm.

The electrical contact reinforcement 24 consists for example of the material called "carbon black" or also of conductive silver in the contact area. The layer thickness typically lies between 1 and 15 µm.

The adhesion-promoter material 22 (primer) is shown in FIG. 15 as a single layer. This layer has a layer thickness of between 1 and 9 µm, preferably of between 1 and 5 µm. It preferably consists of the following material:

| Component | Proportion (%) |
|---|---|
| Methyl ethyl ketone | 60 |
| Butyl acetate | 15 |
| MMA polymer (Tg: 100° C.) | 7 |
| MMA/EA copolymer (Tg: 35° C.) | 13 |
| Silica (SiO2) | 5 |

Tg here is the glass transition temperature (vitrification temperature) of the respective component.

In an alternative, the adhesion-promoter layer 22 can also be two-layered. In this case, it comprises, in addition to the layer just described, a further layer with a layer thickness of between 1 and 8 µm, preferably of between 1 and 4 µm in the following composition:

| Component | Proportion (%) |
|---|---|
| Methyl ethyl ketone | 25 |
| Cyclohexanone | 10 |
| Ethyl acetate | 32 |
| MMA polymer (Tg: 105° C.) | 15 |
| Acrylic acid ester (thickness = 1.102 g/cm$^3$) | 15 |
| Photoinitiator (melting point 45-49° C.) | 3 |

The first-named layer is always located at the boundary surface between the sensor film and the injection-molding material (i.e. it touches the injection-molding material). The additional layer here is arranged such that it is located between the first-named layer and the sensor film.

The layer 26 suppressing the adhesion to the injection-molding material preferably comprises a suitable wax material or the like.

All thermoplastics can be used as injection-molding material 3, these are preferably polymethyl (meth)acrylate, acrylonitrile-butadiene-styrene, polycarbonate or polyamide.

The injection-molding material can be colored or transparent. It can comprise fillers such as glass fibers or carbon fibers, or also be provided without fillers.

The strengthening element preferably consists of plastic, wherein in particular polyethylene terephthalate, polypropylene, polycarbonate, polyethylene naphthalate are suitable, preferably in a thickness from the range of 12-150 µm, particularly preferably from the range of 35-60 µm.

Figure 16:
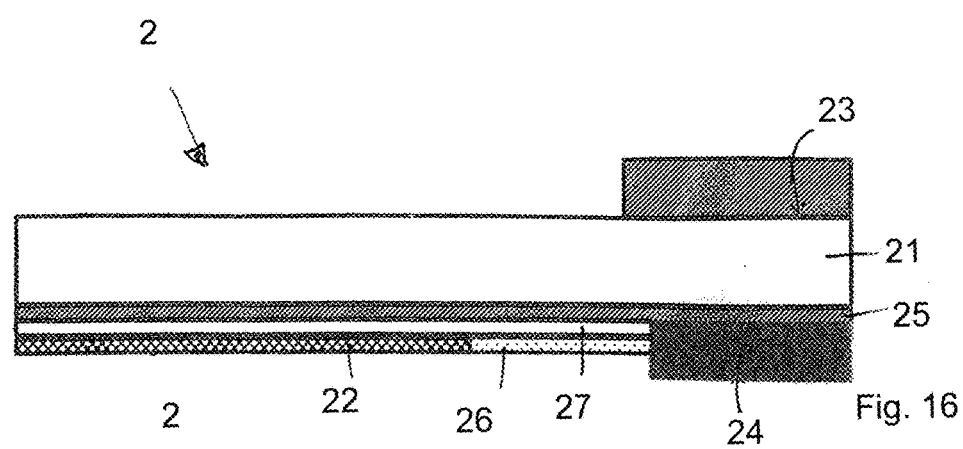

In addition to the layer structure shown in FIG. 15, in which the substrate 21 carries the adhesion-promoter layer 22 or two partial layers of the adhesion-promoter layer 22, and in which the substrate 21 is thus arranged between the electrical functional layer and the injection-molding material, there is a variant in which the situation is precisely the reverse: the substrate 21 carrying the electrical functional layer 25 and the protective layer 27 points away from the injection-molding material 3, and it is the protective layer 27 (or optionally directly the electrical functional layer 25) which carries the adhesion-promoter layer 22 (or two partial layers of the latter), and the optional anti-adhesion material in the layer 26 suppressing the adhesion. This situation is represented in FIG. 16. In this situation the arrangement of the strengthening element 23 and of the contact reinforcement 24 is also inverted.

Figure 17:
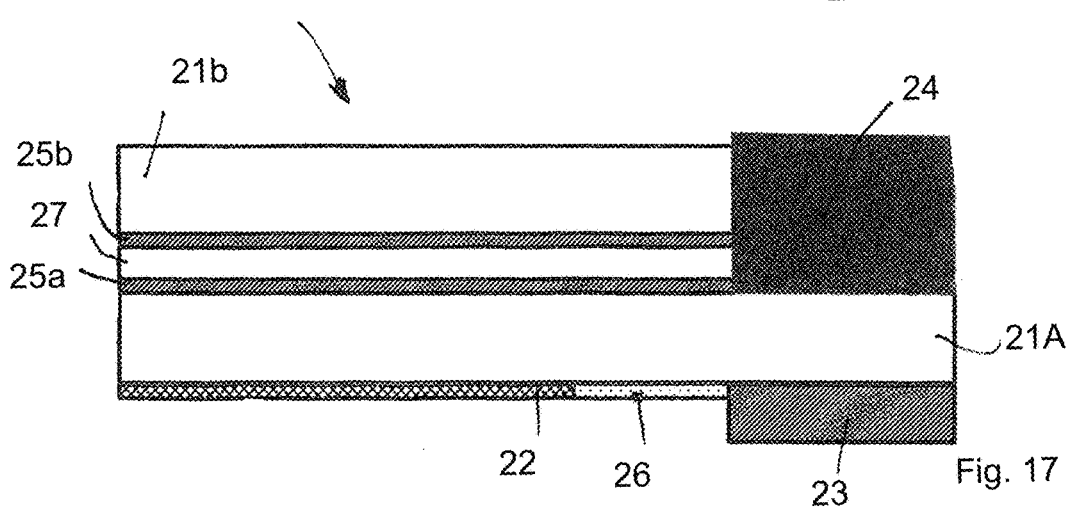

In another modification of the embodiment according to FIG. 15 the second film 2 is a multi-layer body with a plurality of electrical functional layers. In this case, there is a first substrate 21*a* and, on this, the electrical functional layer 25*a*. This in turn carries a protective layer 27, on which the second electrical functional layer 25*b* is located, and a second substrate 21*b* is located on this. Otherwise the layer structure corresponds to what was shown in FIG. 15, and the statements regarding this layer structure apply correspondingly to the embodiment according to FIG. 17.

Several electrical functional layers can occur for example when capacitive components are used which are provided, not in one layer, for instance by the above-named metallic conductor traces, but rather in two layers.

Figure 18:
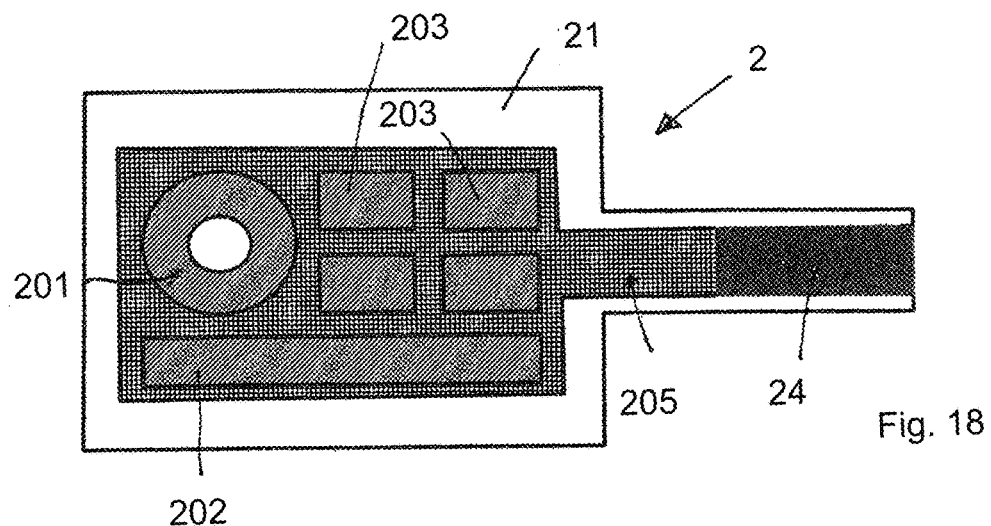
FIGS. 18 and 19 are top views of different embodiments of a film element that can be used in the body according to the invention.
Figure 19:
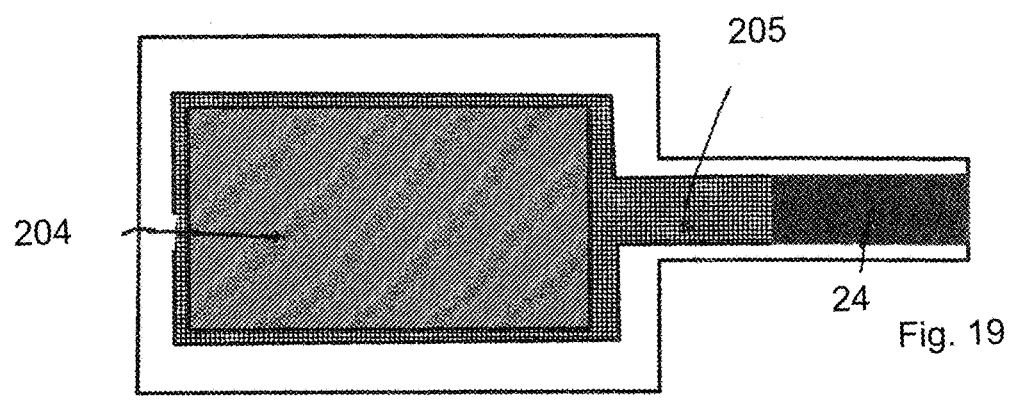

A first film 2 is represented in top view in FIGS. 18 and 19 in different implementations. In the case of FIG. 19, active areas can be recognized, such as for example a rotary control 201, a slide control 202 and buttons 203.

The design of these elements is known per se and need not be explained in the present case.

Alternatively, a touchscreen (touch panel unit) 204 can be provided, see FIG. 19. In the area 205 to be seen outside the previously identified areas, electrical connection lines are provided which lead up to the contact reinforcement 24.

Figure 20:
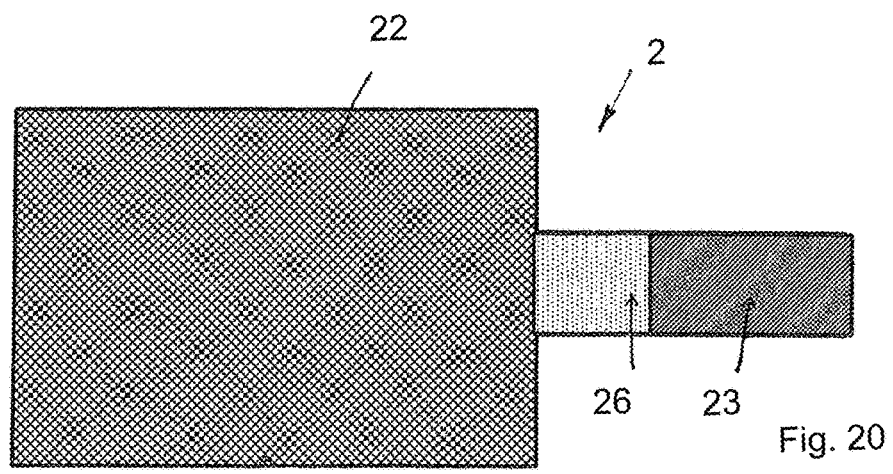
FIG. 20 is a view of a film element according to FIG. 19, FIGS. 21A-21H show, with reference to schematically shown components of an injection-molding die, different production stages of a process for producing a body according to the invention according to a third alternative.

FIG. 20 shows the second film 2 from below with the areas which are provided with an adhesion promoter 22, those which are provided with a material 26 suppressing the adhesion, and those which furthermore comprise the strengthening element 23. With reference to FIG. 20, it becomes particularly clear how it is possible to ensure, in the later body 1 according to FIG. 1, that a tab can protrude from the injection-molding material 3, cf. also the above explanations regarding FIGS. 12*a*-12*c*.

The previous description of the production process for the body 1 was based on the fact that an adhesion-promoter layer 22 and/or a layer 26 suppressing the adhesion is provided.

Still further production processes are to be explained below, in which different tools are used, and in which it is ensured in a mechanical way that in the finished body 1 from FIG. 1 a tab protrudes in the second area 22*b*.

In the embodiments described below, the second film 4 is not described. However, the processes can similarly also be provided when such a second film is to be back-injection molded according to a roll-to-roll process or manual insertion at the same time as the first film. The procedure described above in respect of FIGS. 13A-13D and 14A-14D can in each case also be provided correspondingly in conjunction with the processes described below with reference to FIGS. 21A-21H, 22A-22H, 23A-23H and 24A-24H.

Alternatively or in addition to the provision of the second film 4, the first film can also carry a decoration layer.

In a third process for producing the body 1 according to FIG. 1, an injection mold 9 with two mold halves 9A and 9B is used, wherein the injection mold 9 additionally has a slide 93. The injection mold half 9B here has such a shape that a film bends in the style of the second film 2 with one end. In this end, precisely the slide 93 is provided, namely the slide 93 abuts a stop 94 which is dimensioned such that exactly the typical first film 2 fits precisely between the slide 93 and a surface 95 of the second injection mold half 9B. The slide 93 has a pointed projection 96 which is suitable for separating the second film 2 from a part 97B of the injection-molding cavity which adjoins a first part 97A.

Figure 21A:
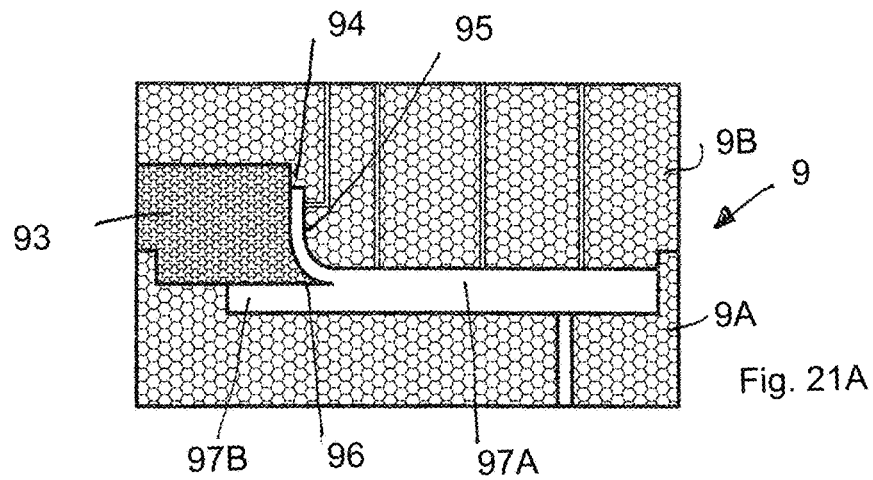
Figure 21B:
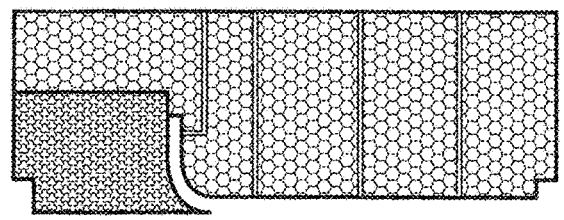
Figure 21B:
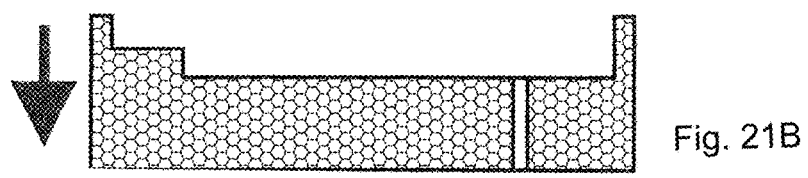
Figure 21C:
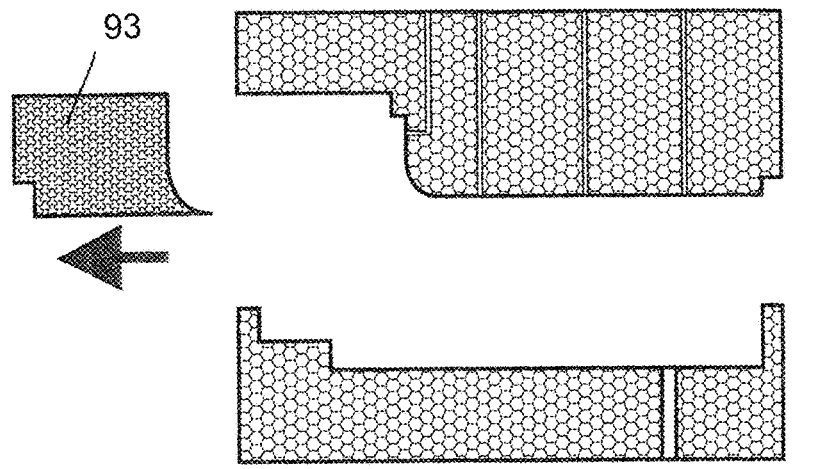
Figure 21D:
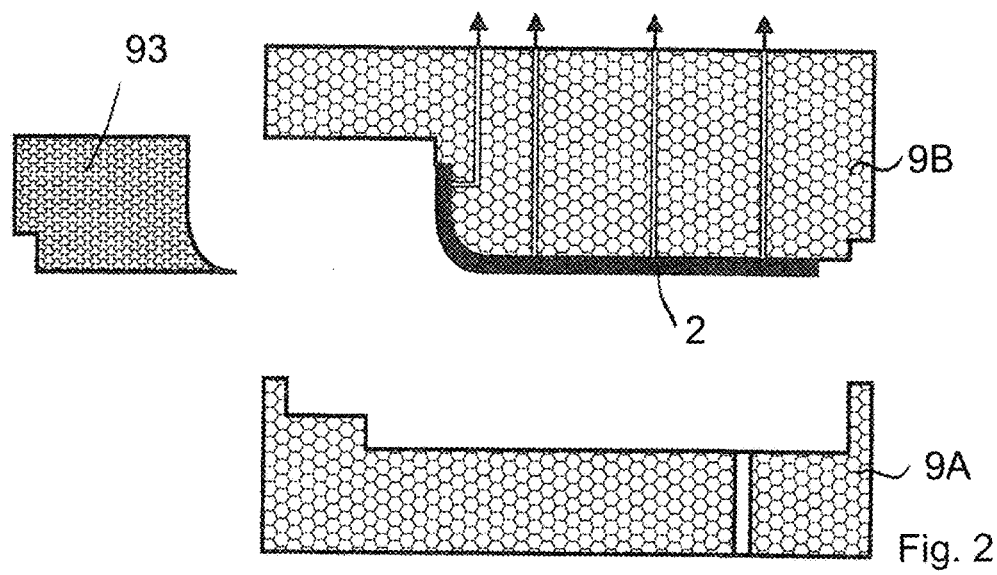
Figure 21E:
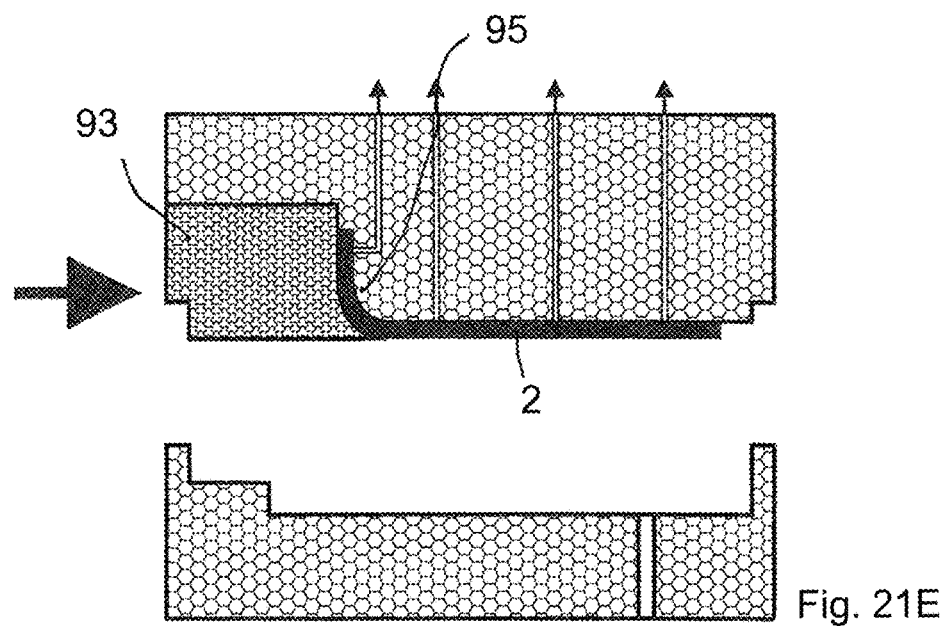

While FIG. 21A shows the injection mold in the closed state, FIG. 21B shows that the mold is opened, and 21C shows that the slide 93 is extended. FIG. 21D then shows that a first film 2 is used which is adapted to the second injection mold half 9B by vacuum (see the arrows). The slide 93 is now retracted, namely by a pressure such that the second film 2 and the electrical functional layer 25 thereof is not damaged; nevertheless the pressure is high enough to separate the second film 2, in its clamped area between the slide 93 and the surface 95, from the injection-molding material.

Figure 21F:
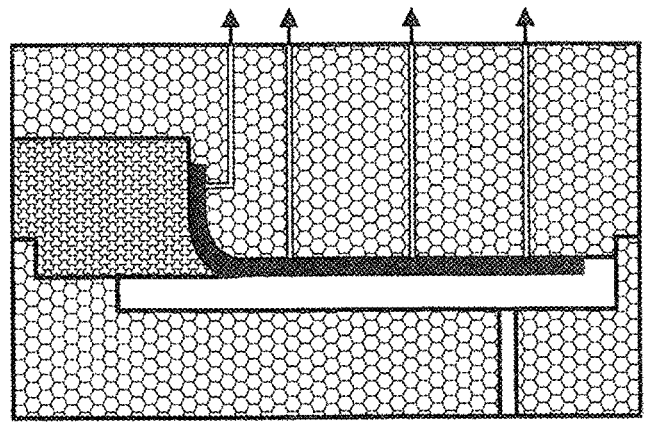
Figure 21G:
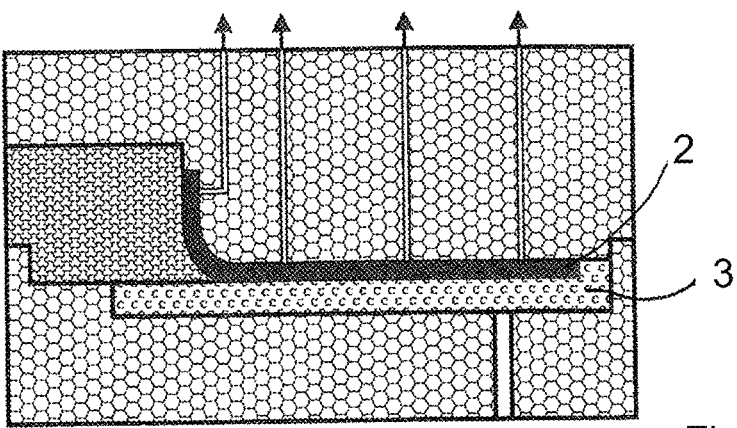
Figure 21H:
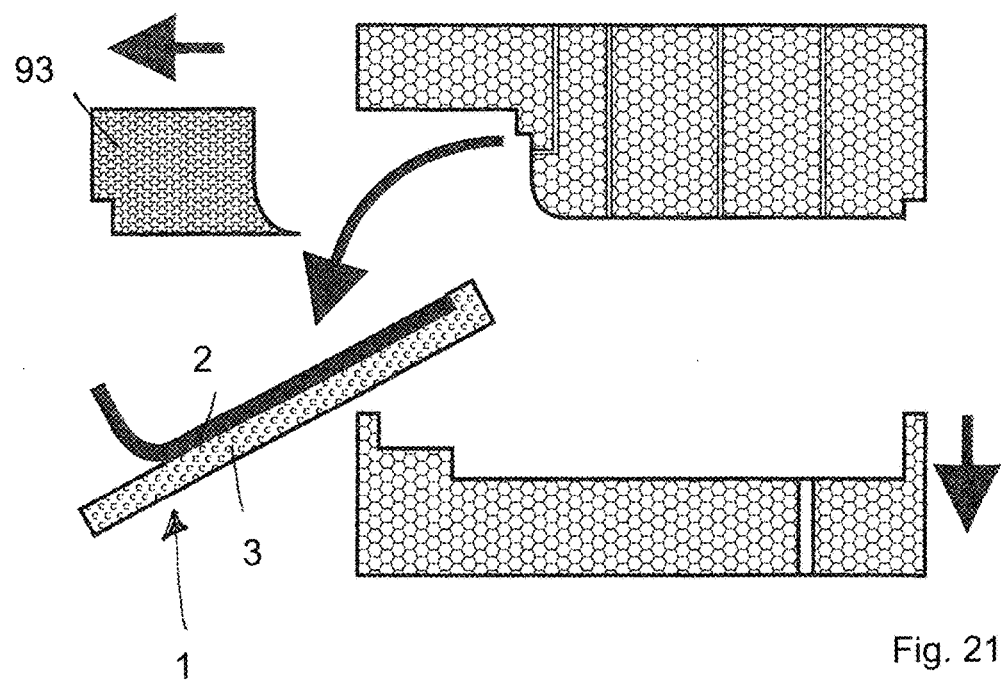

Subsequently, according to FIG. 21F, the injection mold is closed, and injection-molding material 3 is injected according to FIG. 21G. After the injection mold has been opened and the slide 93 has been extended, as shown schematically in FIG. 21H, the finished body 1 can be taken out.

Figure 22A:
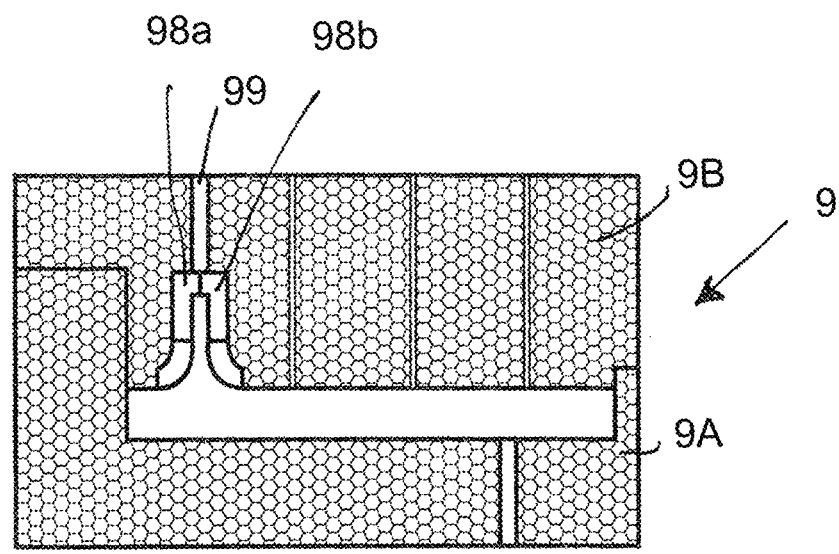
FIGS. 22A-22H show, with reference to schematically shown components of an injection-molding die, different production stages of a process for producing a body according to the invention according to a fourth alternative.
Figure 22B:
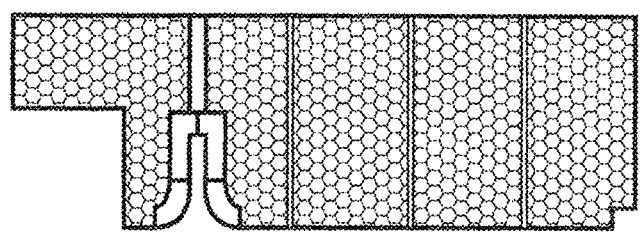
Figure 22B:
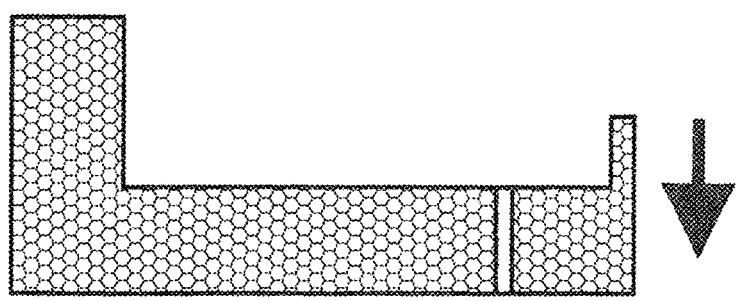
Figure 22C:
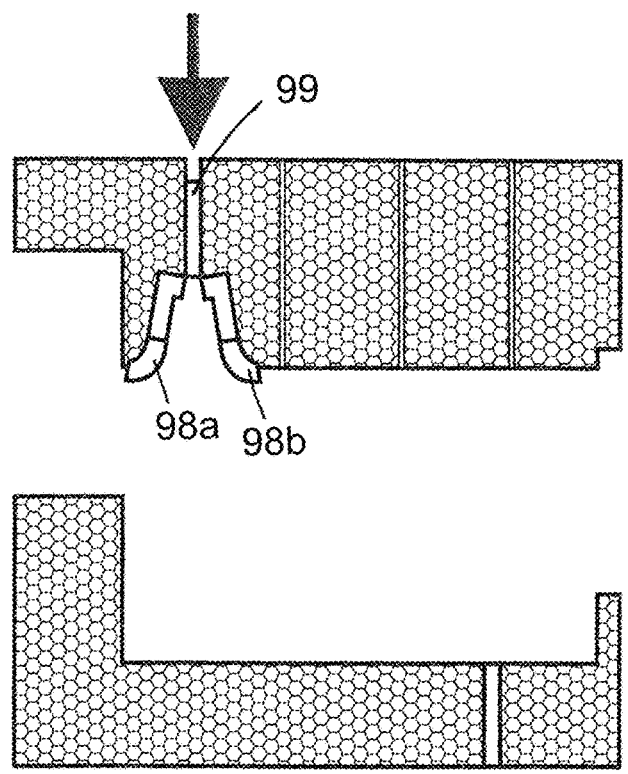
Figure 22D:
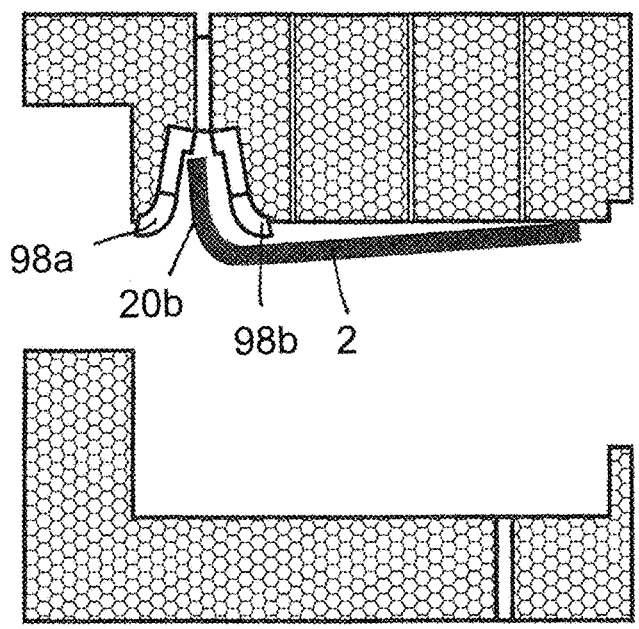

In a fourth process for producing the body 1, the injection mold 9 shown in FIG. 22A in the closed state is used. This has, in a second mold half 9B, two clamping jaws 98*a* and 98*b*, wherein these clamping jaws can be moved apart and back together by a collapsible core 99. With reference to FIG. 22B it becomes clear that the injection mold 9 is opened, then a self-opening of the clamping jaws 98*a* and 98*b* is brought about by moving the collapsible core 99 down, see FIG. 22C, then a second film 2 with a second section 20*b* can be shifted between the two clamping jaws 98*a* and 98*b* (FIG. 22D), and according to FIG. 22E the clamping jaws are closed by moving the collapsible core 99 back up, with the result that the second area 20*b* of the second film 2 is clamped tightly between the two clamping jaws 98*a* and 98*b*.

Figure 22E:
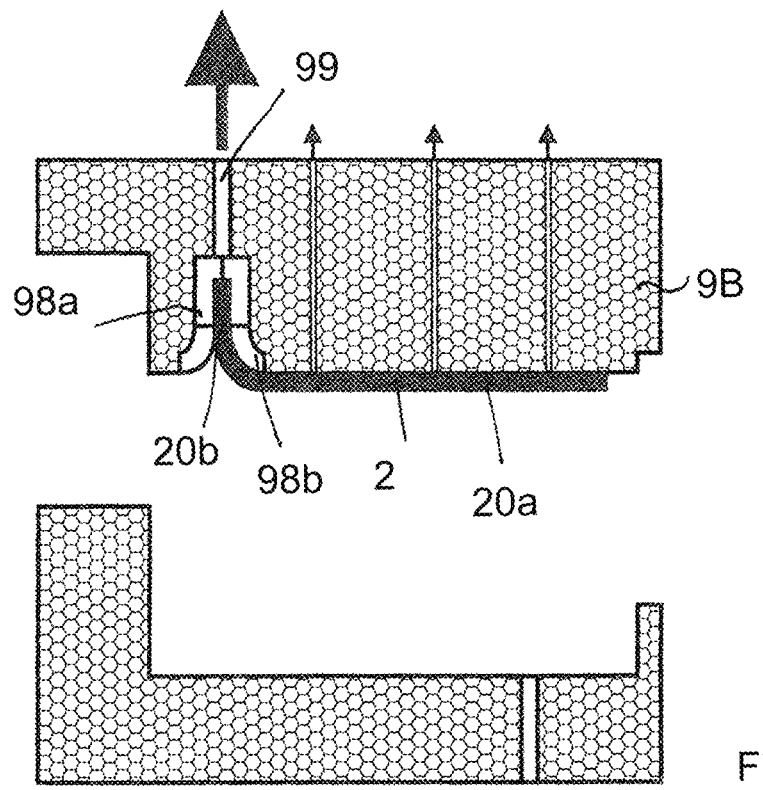
Figure 22F:
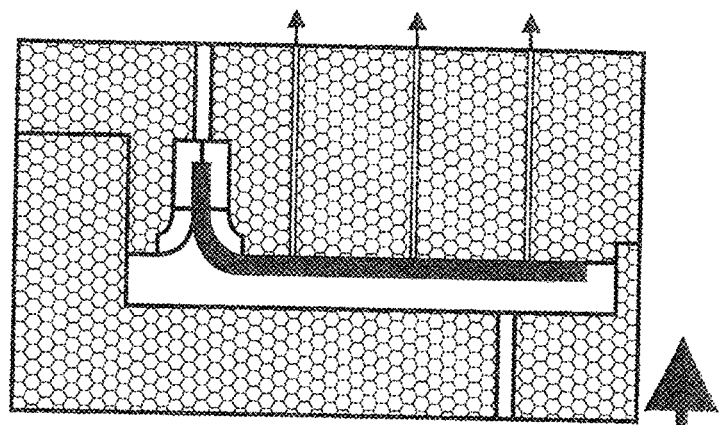
Figure 22G:
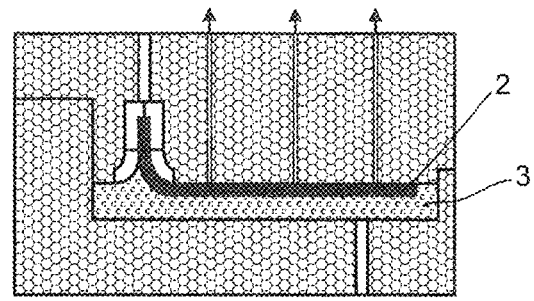
Figure 22H:
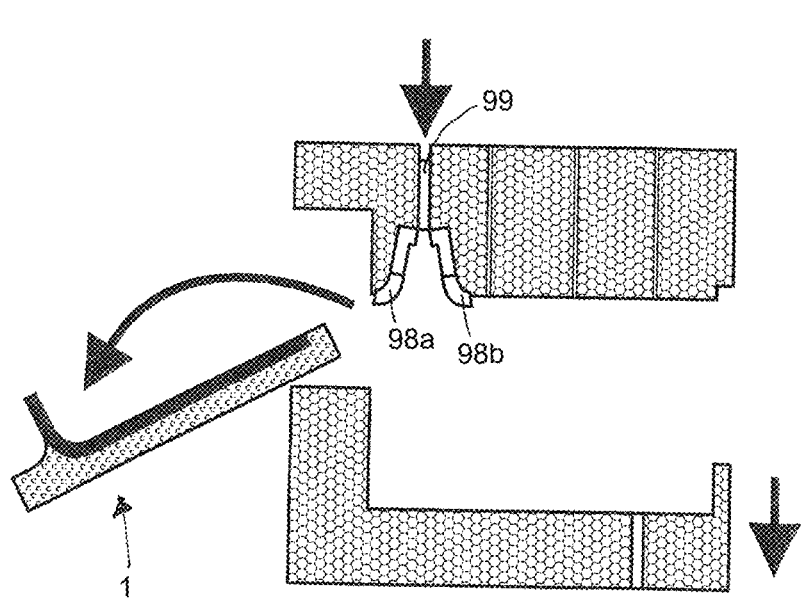
Figure 23A:
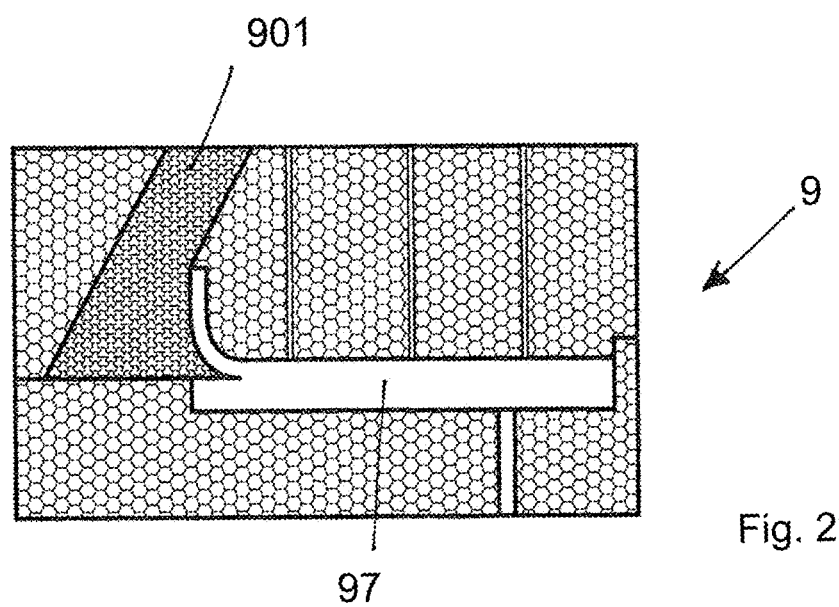
FIGS. 23A-23H show, with reference to schematically shown components of an injection-molding die, different production stages of a process for producing a body according to the invention according to a fifth alternative.
Figure 23B:
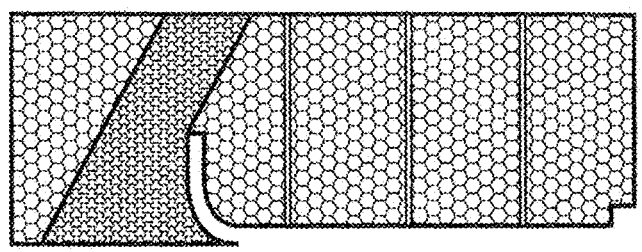
Figure 23B:
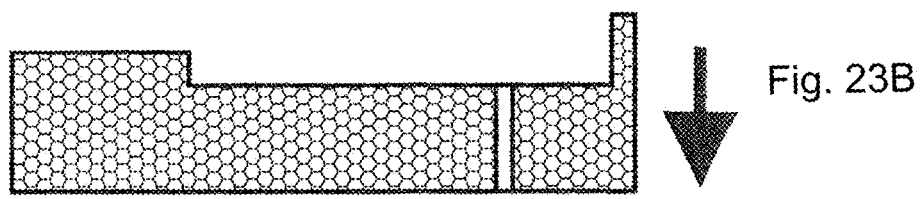
Figure 23C:
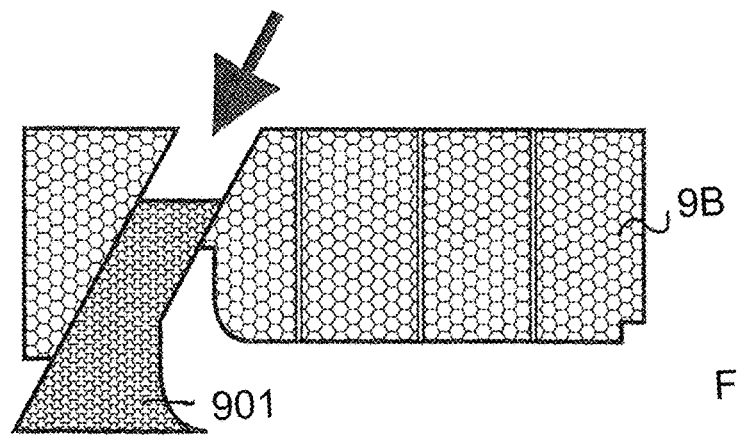
Figure 23C:
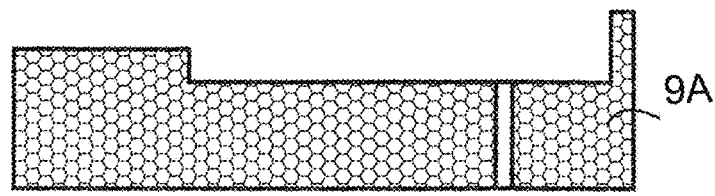
Figure 23D:
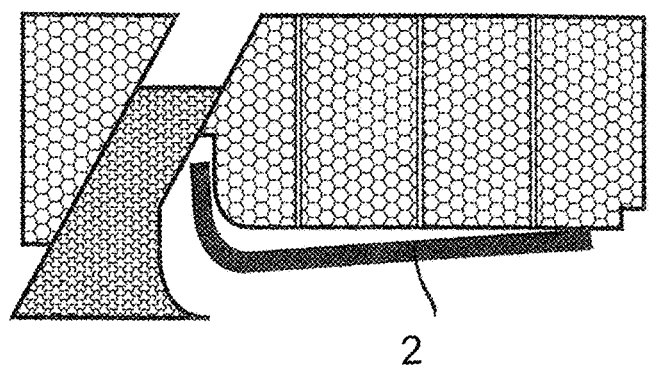
Figure 23D:
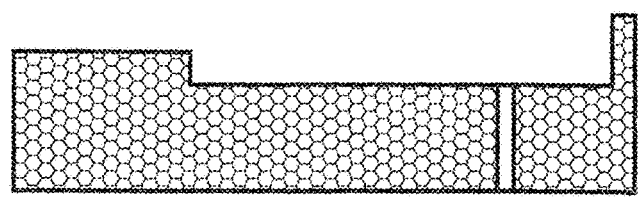
Figure 23E:
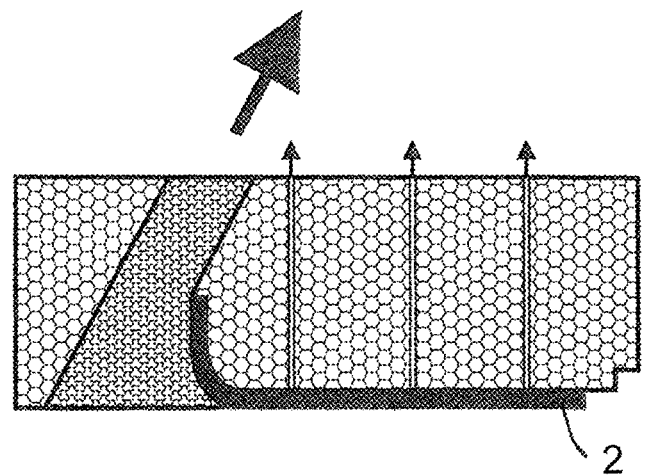
Figure 23E:
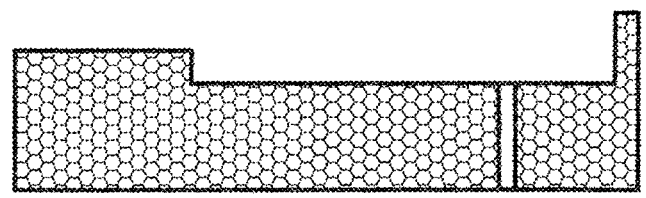
Figure 23F:
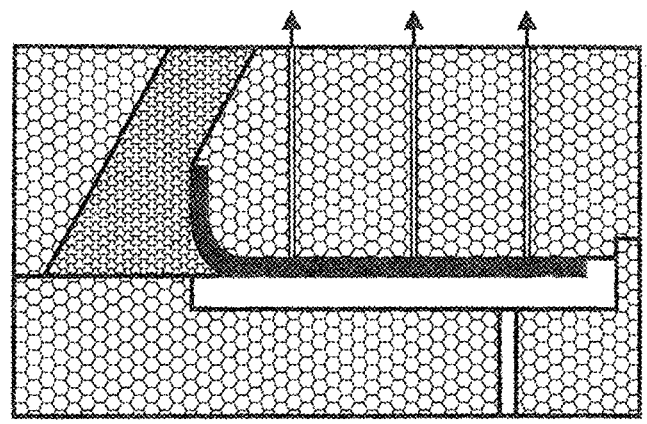
Figure 23G:
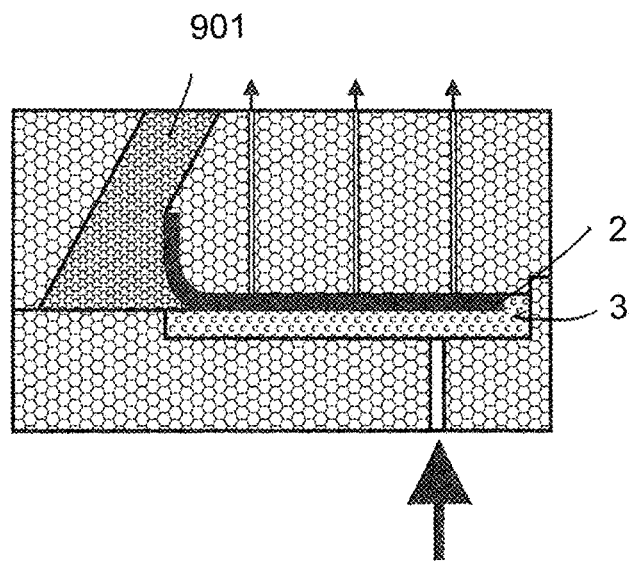
Figure 23H:
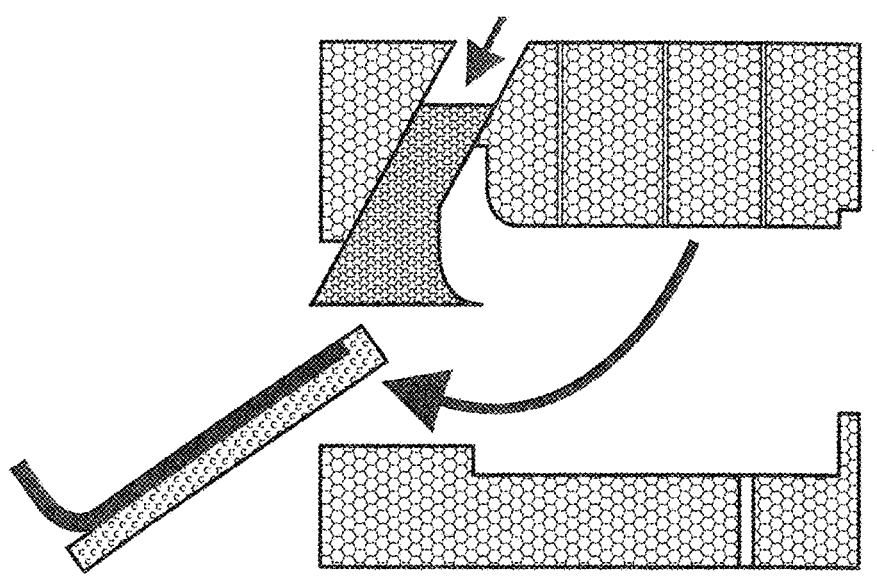
Figure 24A:
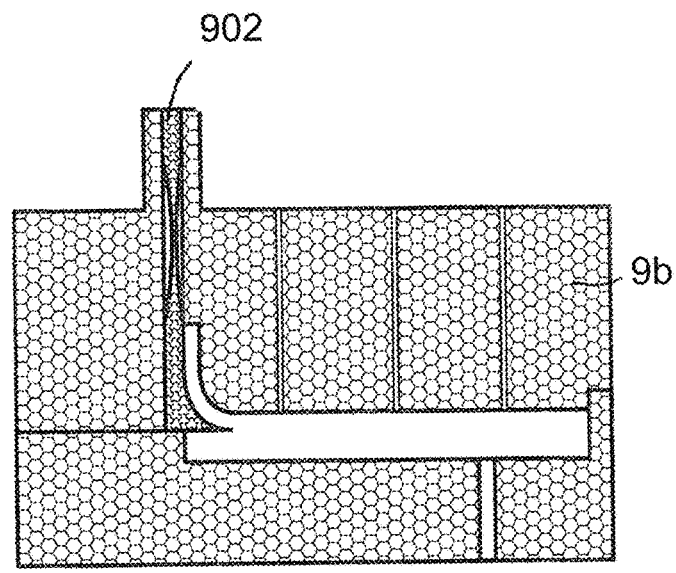
FIGS. 24A-24H show, with reference to schematically shown components of an injection-molding die, different production stages of a process for producing a body according to the invention according to a sixth alternative, FIGS. 25A/B show an alternative embodiment of a body according to the invention, in perspective view from above and below respectively and FIGS. 26A/B show a still further alternative embodiment of a body according to the invention, in perspective view from above and below respectively.
Figure 24B:
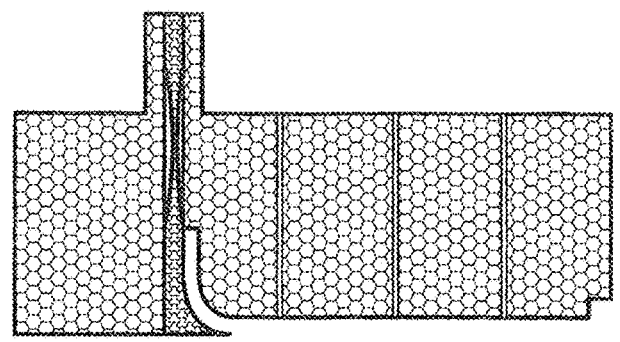
Figure 24B:
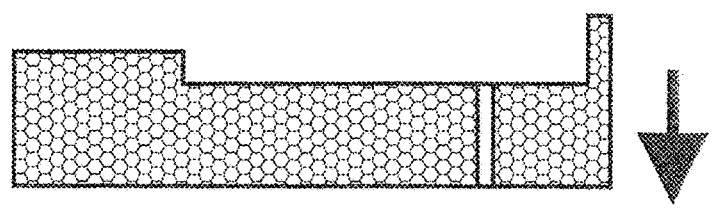
Figure 24C:
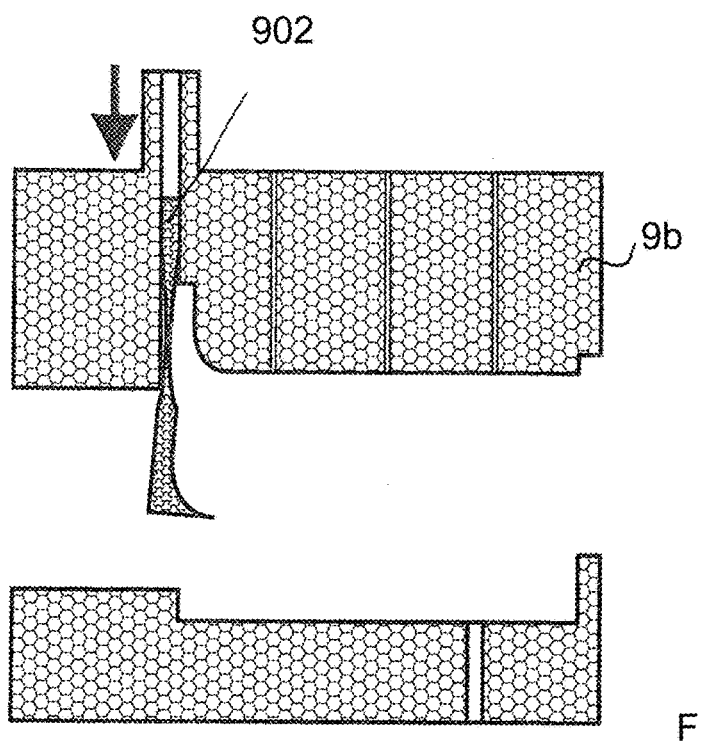
Figure 24D:
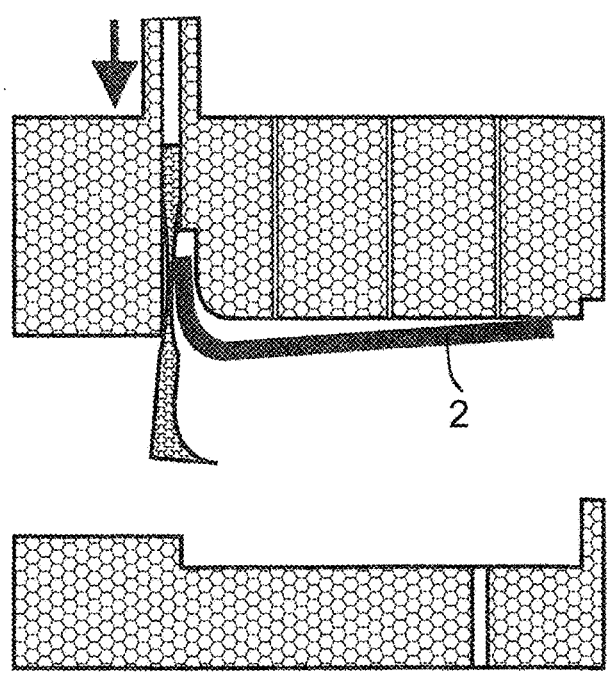
Figure 24E:
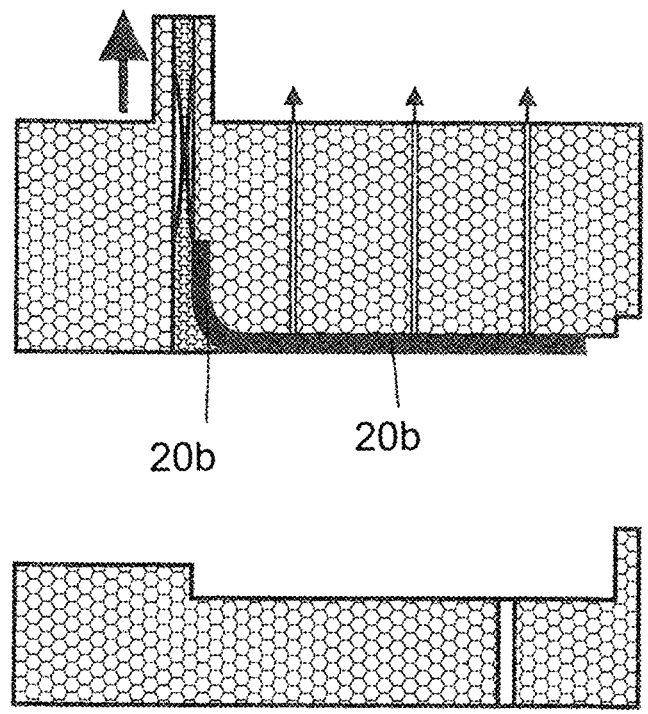
Figure 24F:
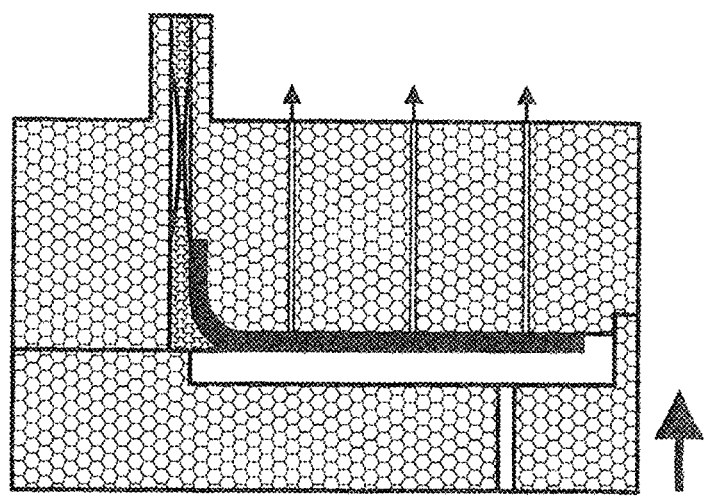
Figure 24G:
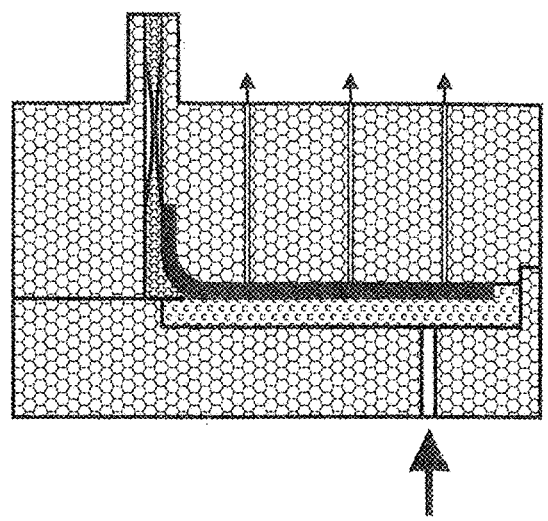
Figure 24H:
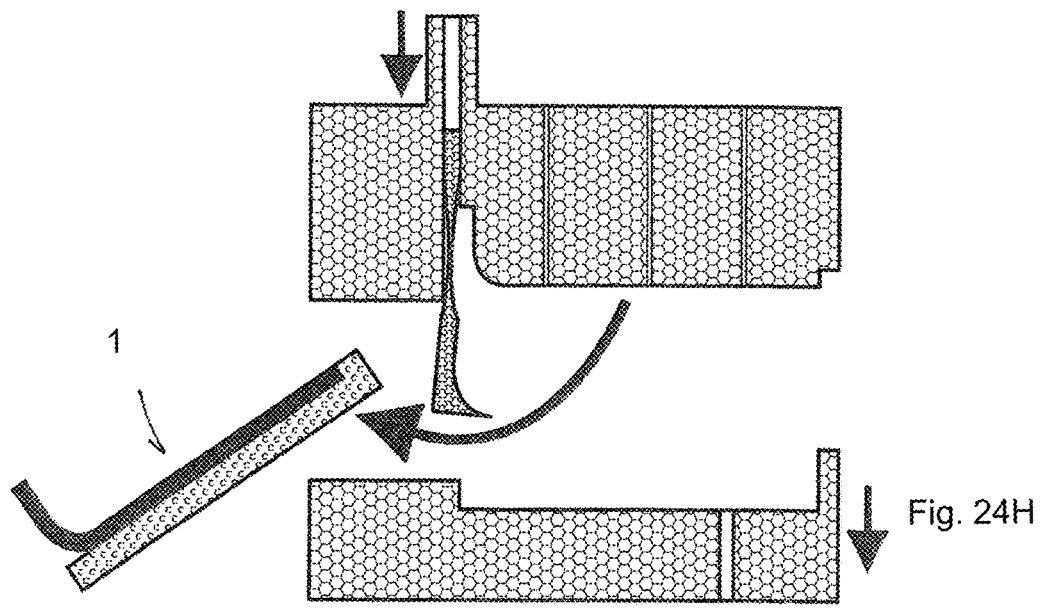

At the same time, as indicated by the arrows in FIG. 22E, negative pressure is applied to the first film 2 in a first area 20*a*, with the result that it adapts to the mold half 9B. The injection mold is then closed (see FIG. 22F), injection-molding material 3 is injected, with the result that the first film 2 is back-injection molded, see FIG. 22G, and subsequently the body 1 can be removed in the case of an opened injection mold and opened clamping jaws 98*a* and 98*b*.

A fifth embodiment of the process for producing the body 1 makes use of the injection molding die 9 shown in FIG. 23 enclosed state. This has an inclined ejector 901. The inclined ejector 901 has, towards the inside of the cavity 97 of the injection molding die 9, substantially the same shape that the slide 93 from FIGS. 21A-21H has. The above statements regarding the slide 93 apply correspondingly to the inclined ejector 901, except that the inclined ejector 901, as can be seen in FIG. 23C, is incorporated in the injection-mold half 9B and is extended in an inclined manner. Otherwise the steps from FIGS. 23A-23H correspond precisely to those which were described above with reference to FIGS. 21A-21H.

In a sixth embodiment of the process according to the invention becoming clear with reference to FIGS. 24A-24H, a spring-loaded ejector 902 mounted in the injection mold half 9B is used. The steps of opening the injection mold, extending the ejector 902, inserting the first film 2, disconnecting its second area 20*b* and at the same time applying suction to the first area 20*a* of the latter, and subsequently back-injection molding and removing or ejecting the finished body 1 are clear with reference to FIGS. 24A-24H.

In the injection molding of polymethyl methacrylate, injection pressure magnitudes of 800-1800 bar at a temperature of the injection mold halves 9A and 9B of 50-90° Celsius are usually implemented, the injection unit not shown in the figures has typical temperatures of between 250° and 280° Celsius. The injection can take place for example within one second. The cooling time can be 12 seconds. Overall, a body can be produced in a cycle of 25 seconds.

In all of the previously described embodiments of the body 1, the latter is designed as a substantially flat plate, from which the tab F protrudes.

Figure 25A:
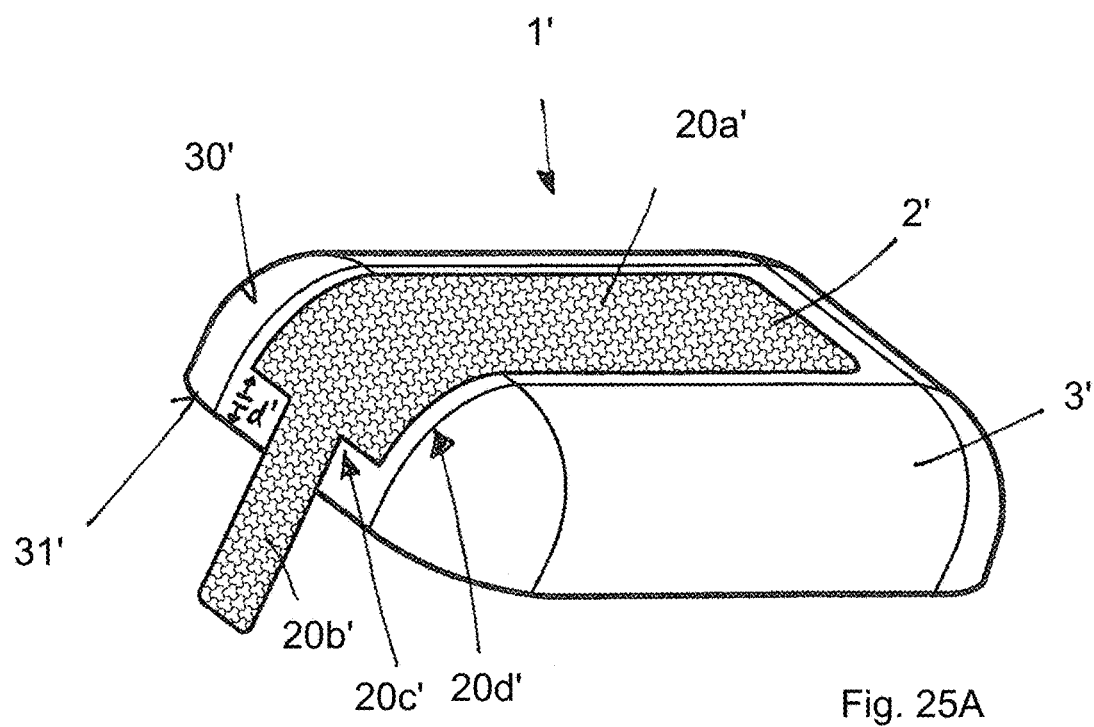
Figure 26A:
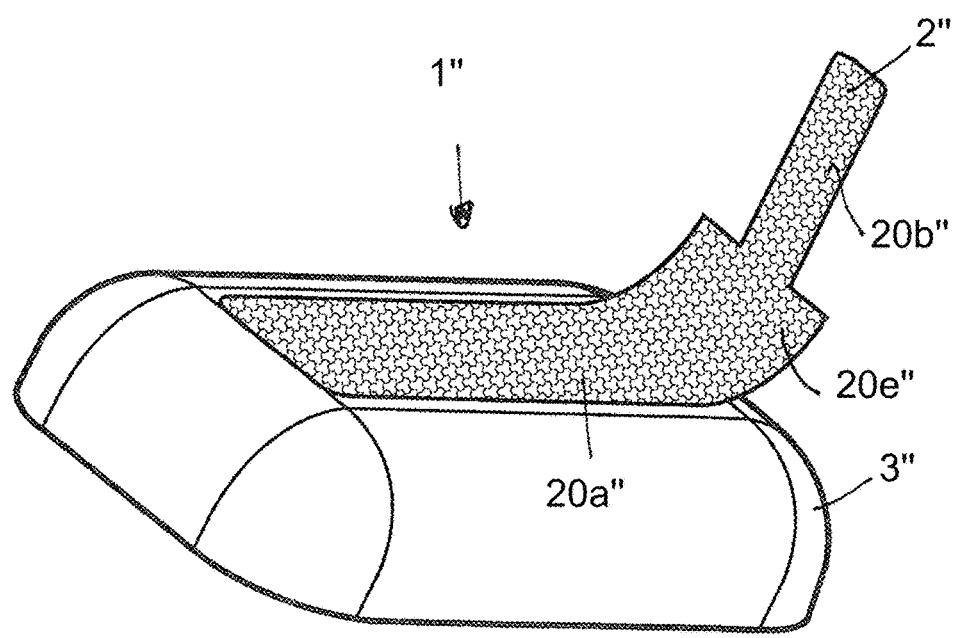
Figure 25B:
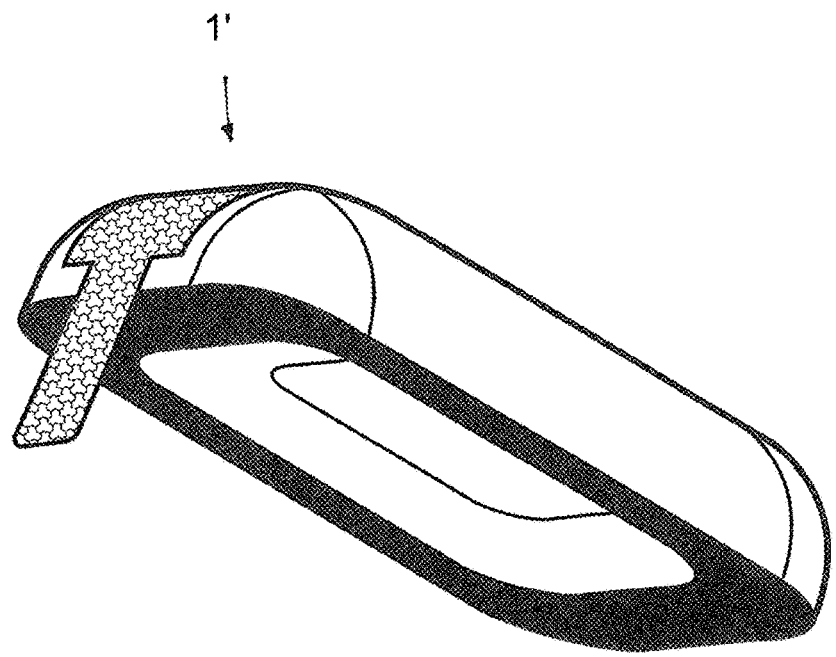
Figure 26B:
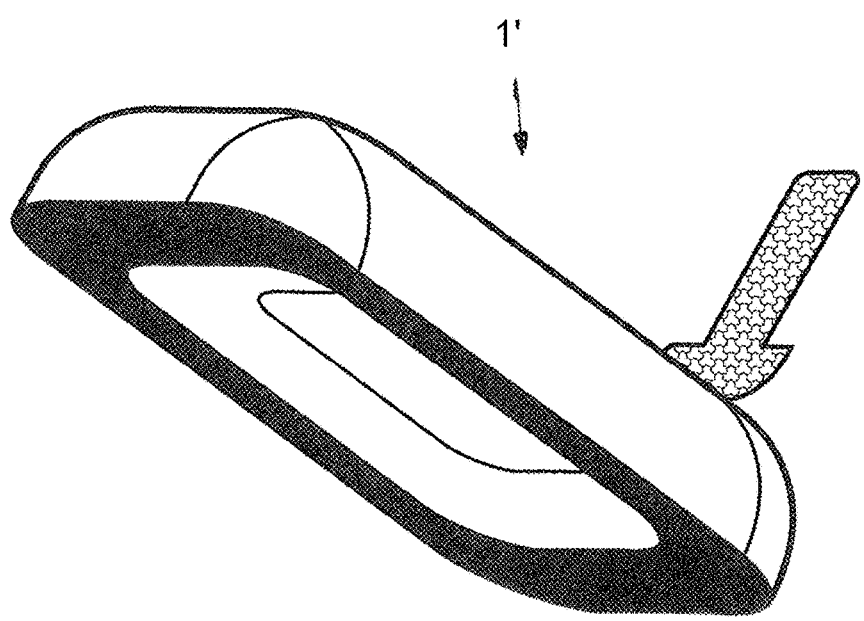

FIGS. 25A and 25B show a further embodiment of the body 1' according to the invention, FIGS. 26A and 26B show a modification 1" of this body 1'.

In this body, a curved surface is provided, over which the first film 2' at least partially extends. In particular, the first section 20a' of the first film 2' is in part guided over a curvature, see the area 20d'. Here too, there is a second area 20b', which protrudes in the style of a tongue from the first area 20a', wherein the transition area 20c' is precisely the area where the adhesion of the first film 2' to the injection-molding material 3' located underneath it ends. The second area 20b' can thus be moved back and forth like a tab. The pivot point of this movement is the transition area 20c', which has distance d' from the edge 31' which delimits the surface 30' of the injection-molding material 3' with the first film 2'.

In an embodiment according to FIG. 26A analogous to the shape of the injection-molding material from FIG. 25a, although the body 1" is provided with a curved surface as a whole, the first film 2" is located on a flat part of this surface. There is a first area 20a" which adheres to the injection-molding material 3". In the present case, not only does a tongue-shaped part 20b" protrude, but a part 20e" of the actual functional area also protrudes.

The three-dimensional body 1' or the three-dimensional body 1" from FIG. 25a/b or 26a/b are only intended to illustrate by way of example that quite different embodiments of the invention could be implemented.

The production processes described above regarding the substantially plate-shaped body 1 can also correspondingly be implemented, with adaptation of the injection molds, in a three-dimensional body in the style of the bodies 1' and 1".

LIST OF REFERENCE NUMBERS

1, 1', 1" body
2, 2', 2" first film
3, 3', 3" plastic main material
4 second film
5 housing
6 electrical or electronic component
7 light-emitting elements
8 plug-in connection
9 injection mold
9A/B mold half
11a, 11b area at the edge of the housing part 5
20a, 20a', 20a" functional area
20b, 20b', 20b" contact area
20c, 20c', 20c" area of surface
21, 21', 21" carrying substrate
21a first substrate
21b second substrate
22 adhesion-promoter layer
23 strengthening element
24 contact reinforcement
25 functional layer
26 suppressing layer
27 additional layer
30 surface
31, 31' delimiting edge
41 carrier layer
42 transfer layer
43a first roll
43b second roll
91 supply line
93 separate slide
94 stop
95 surface
98a, 98b clamping jaws that can be separated from each other
99 collapsible core
100 electrical device
201 rotary control
202 slide control
203 button
204 touchscreen (touch panel unit)
901 inclined ejector
902 spring-loaded ejector
d, d' distances
F tab
$F_S$ closing force
$F_Ö$ opening force

The invention claimed is:

1. A body which has a first film with at least one electrical or electronic functional layer, wherein at least one electrical or electronic component is provided in a functional area of the functional layer, and wherein at least one electrical connection is provided in a contact area of the at least one functional layer, which electrical connection is galvanically coupled to at least one component, wherein the body furthermore comprises a plastic main material with which the first film is partially back-injection molded such that the contact area is at least partially free from plastic main material, wherein the first film is formed such that a tab separated from the plastic main material is provided by a non-back injection-molded part of the first film, which tab adjoins a back-injection molded part of the first film in an area of surface of the body, which is at a distance from an edge of the body delimiting the surface with the first film.

2. The body according to claim 1, wherein the plastic main material predefines a shape of the body which makes it possible at least partially to bring the tab up against the surface of the plastic main material on its side with the first film.

3. The body according to claim 1, wherein the body has a flat surface, on which the first film is arranged, and wherein the tab can be brought into a position or is located in a position in which it protrudes at an angle from the range of from 15° to 90° to the plane from an area of surface which is adjoined on all sides in respect of the surface by plastic main material.

4. The body according to claim 1, wherein the body has a curved surface, on which the first film is arranged, and wherein the tab can be brought into a position or is located in a position in which it protrudes at an angle from the range of from 75° to 0° to a surface normal of the curved surface at an area of surface which is adjoined on all sides in respect of the surface by plastic main material.

5. The body according to claim 1, wherein a transition from a back-injection molded part of the first film to a non-back-injection molded part of the film takes place along a line on the surface which is at a distance of at least 8 mm, from an edge contour of the body delimiting the surface with the first film.

6. The body according to claim 1, further comprising a second film or a lacquer package which is likewise back-injection molded with the plastic main material and has a decoration layer which is over the whole surface or partial and which provides at least one item of information in respect of the at least one electrical or electronic component.

7. The body according to claim 1, wherein the functional layer comprises capacitive components which provide a touch panel functionality.

8. The body according to claim 1, further comprising a stiffening element with a thickness from the range of from 140 to 580 µm, or an additional contact element with a thickness from the range of from 1 to 15 µm, on the tab.

9. The body according to claim 1, wherein the plastic main material is a thermoplastic which comprises polymethyl (meth)acrylate, acrylonitrile-butadiene-styrene, polycarbonate or polyamide.

10. The body according to claim 1, wherein the plastic main material is transparent at least in areas.

11. The body according to claim 1, wherein the functional layer has a plurality of conductor traces which consist of silver, copper, aluminum, chromium or of a metal alloy, and which have a width of between 1 µm and 40 µm and have a distance from each other of between 10 µm and 5 mm and are provided in a layer thickness of from 30 to 60 nm.

12. The body according to claim 1, wherein the functional layer has a plurality of conductor traces which consist of silver, copper, aluminum, chromium or of a metal alloy, and which have a width of 100 µm or more.

13. The body according to claim 1, wherein the functional layer comprises metal nanowires made of silver, copper, gold, metal nanoparticles made of silver, copper or gold, carbon nanotubes, carbon nanoparticles, graphene, or organic conductors or polyaniline or provides organic light-emitting diodes, inorganic or organic photovoltaic cells, display elements provided using electroluminescent materials, electrochromic materials or electrophoretic materials, integrated circuits or inorganic or organic memories.

14. The body according to claim 1, further comprising a substrate carrying the functional layer and made of polyethylene terephthalate, polypropylene, polycarbonate, or polyethylene naphthalate, which is provided in a thickness of between 35 and 60 µm.

15. The body according to claim 14, wherein the substrate is arranged between the functional layer and the plastic main material.

16. The body according to claim 14, wherein the functional layer is arranged between the substrate and the plastic main material.

17. The body according to claim 1, further comprising an adhesion-promoter layer at least on the part of the first film back-injection molded with plastic.

18. The body according to claim 17, wherein the adhesion-promoter layer consists of two partial layers which are formed from different material.

19. An electrical device, with a housing, in or against which the body according to claim 1 is placed, wherein an electrical or electronic component is arranged in the housing, which component is galvanically coupled, via the tab protruding from the plastic main material, to the electrical or electronic functional layer.

20. A process for producing the body according to claim 1 wherein a first film is inserted into an injection mold, wherein the first film, in a first area, has adhesion properties in respect of a predetermined injection-molding material which are qualitatively better than the corresponding adhesion properties in a second area of the first film, wherein the second area has the form of a tongue protruding from the first area, wherein in the process the predetermined injection-molding material is injected into the injection mold with the first film, with the result that the first film is partially back-injection molded and then the produced body is removed, in which, because of the different adhesion properties, injection-molding material adheres to the first film in the first area, but injection-molding material adheres poorly or does not adhere to the first film in the second area.

21. The process according to claim 20, wherein a film is inserted which comprises an adhesion-promoter layer in the first area.

22. The process according to claim 20, wherein a film is inserted which comprises, in the second area, a layer suppressing the adhesion.

23. A process for producing the body according to claim 1, wherein a first film is inserted into an injection mold, which film has a first area from which a second area protrudes in the form of a tongue, and wherein in the process the second area is clamped between two clamping parts and wherein injection-molding material is injected into the injection mold and thus the first area of the first film is back-injection molded.

24. The process according to claim 23, wherein the injection mold is formed such that injection-molding material is provided on both sides of a transition area from the first area to the second area of the first film.

25. The process according to claim 23, wherein the clamping elements comprise a mold half of the injection mold and either a separate slide, an inclined ejector guided in the mold half of the injection mold or a spring-loaded ejector mounted in the mold half of the injection mold.

26. The process according to claim 23, wherein the clamping elements comprise two clamping jaws that can be separated from each other by a collapsible core.

27. The process according to claim 23, wherein a first film is inserted into an injection mold, wherein the first film, in a first area, has adhesion properties in respect of a predetermined injection-molding material which are qualitatively better than the corresponding adhesion properties in a second area of the first film, wherein the second area has the form of a tongue protruding from the first area, wherein in the process the predetermined injection-molding material is injected into the injection mold with the first film, with the result that the first film is partially back-injection molded and then the produced body is removed, in which, because of the different adhesion properties, injection-molding material adheres to the first film in the first area, but injection-molding material adheres poorly or does not adhere to the first film in the second area.

28. The process according to claim 20, wherein a second film is introduced into the injection mold, which film is likewise back-injection molded.

29. The process according to claim 28, wherein, as the second film, a film is inserted which comprises a carrier layer and a transfer layer and is supplied in a roll-to-roll process, wherein, after the back-injection molding, the transfer layer at least partially adheres to the injection-molding material and is detached from the carrier layer, and wherein the carrier layer is taken away in the roll-to-roll process.

30. A film element for use as part of the body according to claim 1, which has a substrate, and an electrical or electronic functional layer, wherein the film element has, on one surface side, a first area and a second area which differ from each other by their different adhesiveness in respect of a predetermined injection-molding material.

31. The film element according to claim 30, wherein the first area is provided with an adhesion-promoter layer and the second area is not.

32. The film element according to claim 30, wherein an adhesion-promoter layer is applied over the whole surface in the first and in the second area, wherein in the second area on the adhesion-promoter layer a layer suppressing the adhesion is provided.

* * * * *